US010379430B2

(12) United States Patent
Tanaka

(10) Patent No.: US 10,379,430 B2
(45) Date of Patent: Aug. 13, 2019

(54) DUSTPROOF APPARATUS, IMAGE DISPLAY SYSTEM, AND CONTROL METHOD

(71) Applicant: SONY CORPORATION, Tokyo (JP)

(72) Inventor: Chiharu Tanaka, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/781,793

(22) PCT Filed: Oct. 24, 2016

(86) PCT No.: PCT/JP2016/004672
§ 371 (c)(1),
(2) Date: Jun. 6, 2018

(87) PCT Pub. No.: WO2017/122237
PCT Pub. Date: Jul. 20, 2017

(65) Prior Publication Data
US 2018/0364551 A1 Dec. 20, 2018

(30) Foreign Application Priority Data

Jan. 15, 2016 (JP) .................................. 2016-005953

(51) Int. Cl.
*G03B 21/16* (2006.01)
*G03B 21/00* (2006.01)
(Continued)

(52) U.S. Cl.
CPC ............. *G03B 21/16* (2013.01); *G03B 21/00* (2013.01); *H04N 5/64* (2013.01); *H04N 9/3144* (2013.01);
(Continued)

(58) Field of Classification Search
CPC .... G03B 21/16; G03B 21/145; H04N 9/3141; H04N 9/3144; H04N 9/3194; H05K 5/06;
(Continued)

(56) References Cited

U.S. PATENT DOCUMENTS

| 2010/0165308 A1* | 7/2010 | Morikuni | ............... G03B 21/28 353/98 |
| 2011/0188005 A1* | 8/2011 | Miyazawa | ............. G03B 21/16 353/58 |

(Continued)

FOREIGN PATENT DOCUMENTS

| JP | 2001-228543 A | 8/2001 |
| JP | 2002-174856 A | 6/2002 |

(Continued)

OTHER PUBLICATIONS

International Search Report dated Jan. 17, 2017 in PCT/JP2016/004672 filed Oct. 24, 2016.

*Primary Examiner* — Sultan Chowdhury
(74) *Attorney, Agent, or Firm* — Oblon, McClelland, Maier & Neustadt, L.L.P.

(57) ABSTRACT

A dustproof apparatus according to an embodiment of the present technology includes a casing portion, a fan portion, a sensor unit, and a control unit. The casing portion is capable of accommodating an image display apparatus and includes an inlet and an outlet that discharges air sucked in from the inlet. The fan portion is provided at the outlet or the inlet. The sensor unit is capable of respectively measuring a first temperature which is a temperature of the air in a vicinity of the inlet and a second temperature which is a temperature of the air in a vicinity of the outlet. The control unit controls drive of the fan portion on a basis of a temperature difference between the first temperature and the second temperature measured by the sensor unit.

10 Claims, 12 Drawing Sheets

(51) Int. Cl.
  *H05K 7/20* (2006.01)
  *H04N 5/64* (2006.01)
  *H04N 9/31* (2006.01)
(52) U.S. Cl.
  CPC ..... *H05K 7/20145* (2013.01); *H05K 7/20181* (2013.01); *H05K 7/20209* (2013.01)
(58) Field of Classification Search
  CPC ............. H05K 5/0017; H05K 7/20145; H05K 7/20181; H05K 7/20209
  See application file for complete search history.

(56) References Cited

U.S. PATENT DOCUMENTS

| | | | |
|---|---|---|---|
| 2012/0075599 A1* | 3/2012 | Park | G03B 21/14 353/121 |
| 2012/0257172 A1* | 10/2012 | Shirakura | G03B 21/16 353/61 |
| 2014/0111777 A1* | 4/2014 | Miyata | G03B 21/16 353/58 |
| 2015/0185594 A1* | 7/2015 | Chen | G03B 21/145 353/52 |
| 2015/0338725 A1* | 11/2015 | Kase | G03B 21/2013 353/58 |

FOREIGN PATENT DOCUMENTS

| | | |
|---|---|---|
| JP | 2003-29764 A | 1/2003 |
| JP | 2003-162005 A | 6/2003 |
| JP | 2008-172118 A | 7/2008 |
| JP | 2010-250083 A | 11/2010 |
| JP | 2010-286750 A | 12/2010 |
| JP | 2014-170215 A | 9/2014 |
| JP | 2015-36789 A | 2/2015 |

* cited by examiner

DUSTPROOF APPARATUS, IMAGE DISPLAY SYSTEM, AND CONTROL METHOD

TECHNICAL FIELD

The present technology relates to a dustproof apparatus for preventing an influence of dust and the like on a projector and the like, an image display system including the dustproof apparatus and an image display apparatus, and a control method for the dustproof apparatus.

BACKGROUND ART

Patent Literature 1 describes a filter device 2 for preventing an influence of dust, soot, and the like on a projector 3 provided in a poor environment, as shown in FIG. 1 thereof. The filter device 2 includes an external casing that includes an air intake window 10 covered by a filter unit 14, a fan 15 that blows cooling air onto the projector 3, and a discharge window 11 provided in front of a discharge port 6 of the projector 3. The projector 3 is set in the external casing 13, and these are attached to a lid plate portion connected to a ceiling hanger (both of which are not numbered) (paragraphs [0013], [0017], [0023], etc. in specification of Patent Literature 1).

Patent Literature 2 describes a projector case 1A in which, as shown in FIG. 5 thereof, an internal space is divided into a first space H1 including a ventilation port 3 and a ventilation fan 5 and a second space H2 including an exhaust port 4 and an exhaust fan 6. In this projector case 1A, the ventilation fan 5 and the exhaust fan 6 are controlled on the basis of a temperature difference between an external temperature and a temperature of the second space H2. Accordingly, a driving state of a projector can be controlled in accordance with an operation state thereof, and running costs can be suppressed (paragraphs [0018], [0021], etc. in specification of Patent Literature 2).

CITATION LIST

Patent Literature

Patent Literature 1: Japanese Patent Application Laid-open No. 2003-162005
Patent Literature 2: Japanese Patent Application Laid-open No. 2015-36789

DISCLOSURE OF INVENTION

Technical Problem

In order to effectively cool an image display apparatus accommodated in a dustproof apparatus, it is necessary to appropriately control a fan mechanism of the dustproof apparatus in accordance with drive of the image display apparatus. If the fan mechanism is wastefully driven unnecessarily, problems including an increase in power consumption, noises, and the like arise.

In view of the circumstances as described above, an object of the present technology is to provide a dustproof apparatus, an image display system, and a control method with which a fan portion can be controlled appropriately in accordance with drive of an image display apparatus.

Solution to Problem

To attain the object described above, a dustproof apparatus according to an embodiment of the present technology includes a casing portion, a fan portion, a sensor unit, and a control unit.

The casing portion is capable of accommodating an image display apparatus and includes an inlet and an outlet that discharges air sucked in from the inlet.

The fan portion is provided at the outlet or the inlet.

The sensor unit is capable of respectively measuring a first temperature which is a temperature of the air in a vicinity of the inlet and a second temperature which is a temperature of the air in a vicinity of the outlet.

The control unit controls drive of the fan portion on a basis of a temperature difference between the first temperature and the second temperature measured by the sensor unit.

In this dustproof apparatus, the drive of the fan portion is controlled on the basis of the difference between the first temperature in the vicinity of the inlet and the second temperature in the vicinity of the outlet. Accordingly, it becomes possible to appropriately control the fan portion in accordance with the drive of the image display apparatus and realize saving of power consumption and suppression of noises.

The control unit may control the drive of the fan portion on a basis of a temporal change of the temperature difference.

Accordingly, the fan portion can be controlled accurately in accordance with the drive of the image display apparatus.

The control unit may start the drive of the fan portion in a case where the temperature difference becomes equal to or larger than a first threshold value and stop the drive of the fan portion in a case where the temperature difference becomes smaller than the first threshold value.

Accordingly, the fan portion can be controlled appropriately in accordance with the drive of the image display apparatus.

The control unit may stop the drive of the fan portion in a case where, while the fan portion is driven, a reduction amount of the temperature difference per unit time becomes equal to or larger than a predetermined threshold value.

Accordingly, it becomes possible to readily stop the drive of the fan portion in accordance with the stop of the drive of the image display apparatus. As a result, saving of power consumption and suppression of noises can be realized.

The control unit may stop the drive of the fan portion in a case where, while the fan portion is driven, a reduction amount of the temperature difference with respect to the temperature difference at a predetermined timing, that is obtained after an elapse of a predetermined time since the predetermined timing, becomes equal to or larger than a second threshold value.

Accordingly, it becomes possible to easily control the fan portion on the basis of the temporal change of the temperature difference.

The second threshold value may be set on a basis of a reduction amount of the temperature difference with respect to the temperature difference at a timing at which the image display apparatus that operates in a high-luminance mode with highest luminance is switched to a low-luminance mode with lowest luminance, that is obtained after an elapse of the predetermined time since that switch timing.

Accordingly, it becomes possible to appropriately control the fan portion in accordance with the drive of the image display apparatus without being influenced by the switch of the luminance mode.

The image display apparatus may include a first supply port for supplying the air to an optical system including a light source and a second supply port for supplying the air to a cooling unit for cooling the light source. In this case, the dustproof apparatus may further include a division portion that divides an internal space of the casing portion into a first area including the first supply port and a second area including the second supply port. Further, the sensor unit may be provided in the second area.

In this dustproof apparatus, the internal space of the casing portion is divided into the first area for supplying air to the optical system and the second area for supplying air to the cooling unit. By providing the sensor unit in the second area, the temperature difference generated in accordance with the drive of the image display apparatus can be measured highly accurately. As a result, the fan portion can be controlled accurately in accordance with the drive of the image display apparatus.

The inlet may include a first suction area that opposes the first supply port and sucks in the air into the first area and a second suction area that opposes the second supply port and sucks in the air into the second area. In this case, the casing portion may include a filter portion provided in the first suction area. Further, the sensor unit may include a first temperature sensor provided in a vicinity of the second suction area and a second temperature sensor provided in a vicinity of the outlet.

By providing the filter portion in the first suction area, clean air can be supplied to the optical system. Meanwhile, it is possible to supply air to the cooling unit via the second suction area at a high flow rate. By providing the first temperature sensor in the second suction area, the first temperature can be measured highly accurately.

The image display apparatus may include a first outlet for discharging air sucked in from the first supply port and a second outlet for discharging air sucked in from the second supply port. In this case, the division portion may perform the division into the first area and the second area such that the first outlet is included in the first area and the second outlet is included in the second area. Further, the second temperature sensor may be provided between the outlet and the second outlet.

Since the second temperature sensor is provided in the vicinity of the second outlet, the temperature of air warmed by the cooling unit is measured as the second temperature. Accordingly, it becomes possible to measure the temperature difference generated in accordance with the drive of the image display apparatus with high accuracy.

The fan portion may be provided between the outlet and the first outlet. In this case, the second temperature sensor may be provided at a position deviated from a flow channel of air sucked in by the fan portion.

Accordingly, the second temperature can be measured accurately by the second temperature sensor.

An image display system according to an embodiment of the present technology includes an image display apparatus and the dustproof apparatus.

A control method according to an embodiment of the present technology includes measuring a first temperature which is a temperature of air in a vicinity of an inlet of a dustproof apparatus capable of accommodating an image display apparatus and a second temperature which is a temperature of air in a vicinity of an outlet of the dustproof apparatus that discharges air sucked in from the inlet.

Drive of a fan portion provided at the outlet or the inlet of the dustproof apparatus is controlled on a basis of a temperature difference between the measured first temperature and second temperature.

Advantageous Effects of Invention

As described above, according to the present technology, the fan portion can be controlled appropriately in accordance with the drive of the image display apparatus. It should be noted that the effects described herein are not necessarily limited, and any effect described in the present disclosure may be obtained.

MODES FOR CARRYING OUT THE INVENTION

Hereinafter, embodiments of the present technology will be described with reference to the drawings.

[Configuration of Image Display System]

Figure 1:
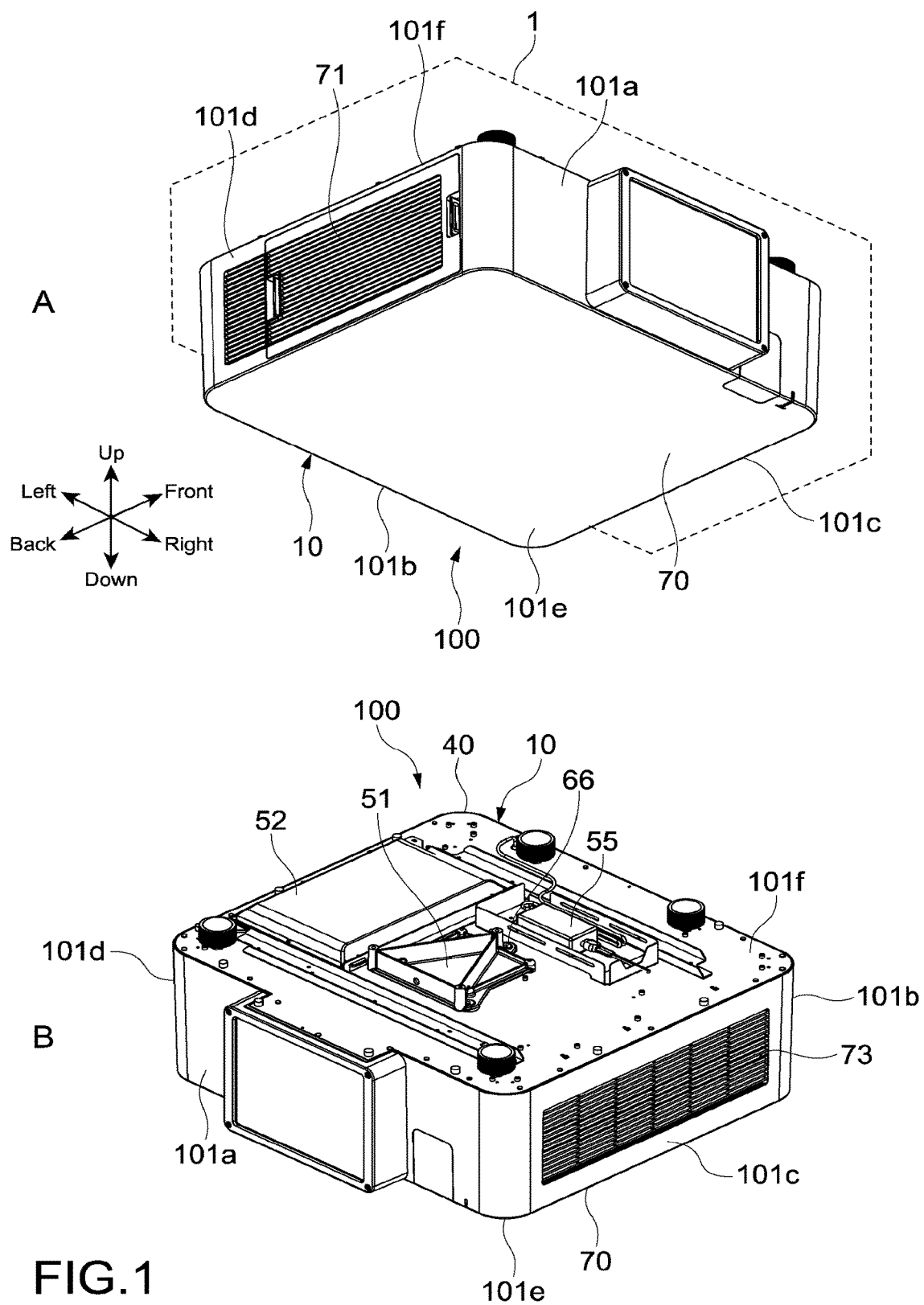
FIG. 1 Schematic diagrams showing an appearance example of an image display system according to an embodiment of the present technology.
Figure 2:
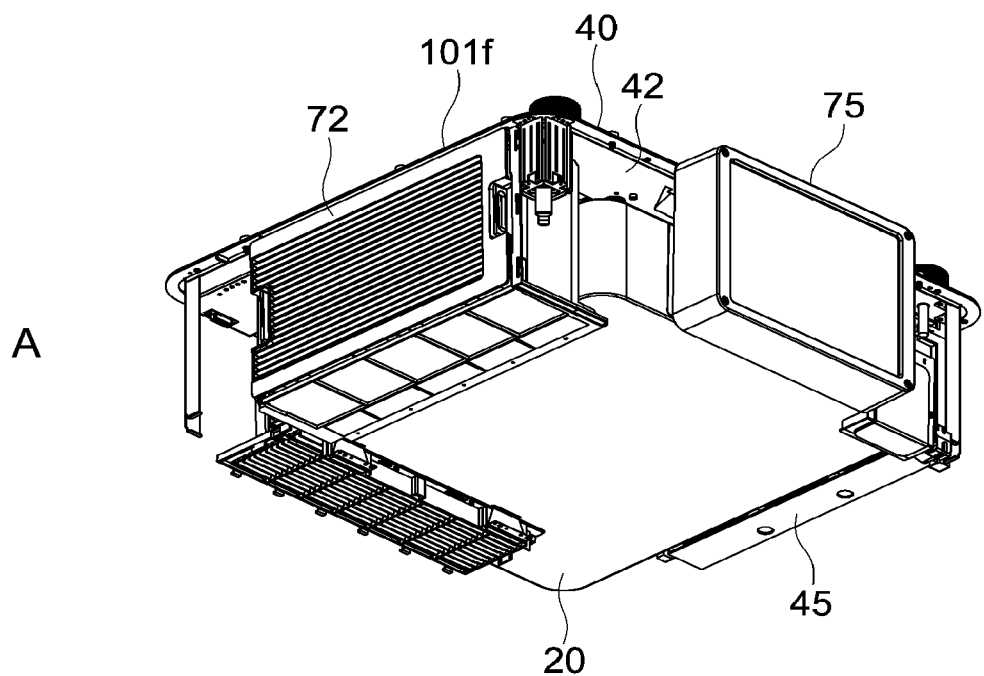
FIG. 2 Diagrams in which a part of a top cover of a dustproof apparatus of the image display system is omitted.
Figure 2:
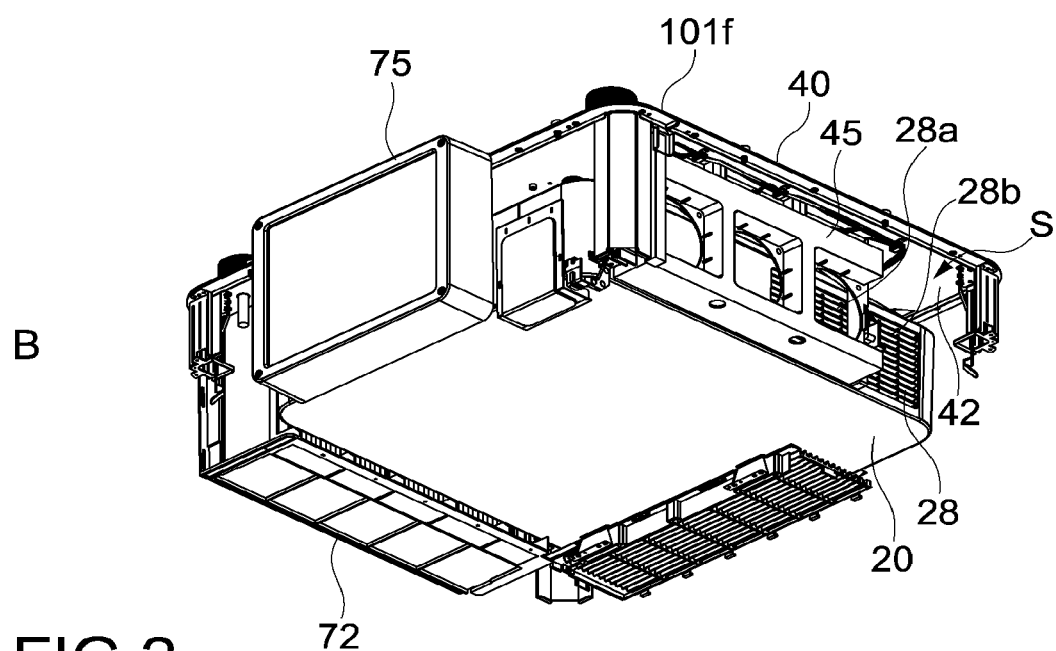

FIG. 1 are schematic diagrams showing an appearance example of an image display system according to an embodiment of the present technology. FIG. 2 are diagrams in which a part of a top cover of a dustproof apparatus of the image display system is omitted. As shown in FIGS. 1 and 2, an image display system 100 includes a dustproof apparatus 10 and an image display apparatus 20 accommodated in the dustproof apparatus 10.

As shown in FIG. 1A, the image display system 100 is used while being set on a ceiling 1. Hereinafter, a width direction, a depth direction, and a height direction are determined as viewed from a projection side on which an image is to be projected. As viewed from the projection side, respective surfaces of the image display system 100 are defined as a front surface 101a, a rear surface 101b, a right-hand side surface 101c, a left-hand side surface 101d, a lower surface 101e, and a setting surface 101f. Further, descriptions will be given while referring to sides where these surfaces are respectively located as a front side, a rear side, a right-hand side, a left-hand side, a lower side, and an upper side.

FIG. 1B is a diagram of the image display system 100 as viewed from the setting surface 101f side (upper side). The dustproof apparatus 10 includes a plate-like base portion 40 and a top cover 70 that is to be attached to the base portion 40. By attaching the top cover 70 to the base portion 40, an internal space for accommodating the image display apparatus 20 shown in FIG. 2 is formed. In this embodiment, the top cover 70 and the base portion 40 form a casing portion.

The setting surface 101f becomes a part of the base portion 40, and the front surface 101a, the rear surface 101b, the right-hand side surface 101c, the left-hand side surface 101d, and the lower surface 101e become a part of the top cover 70. As shown in FIGS. 2A and 2B, the image display apparatus 20 is provided on a support surface 42 of the base portion 40 (also see FIG. 4) on a side opposite to the setting surface 101f. Then, the top cover 70 is attached to the base portion 40 so as to cover the image display apparatus 20.

An inlet 71 is formed on the left-hand side surface 101d of the top cover 70. Further, an outlet 73 for discharging air sucked in from the inlet 71 is formed on the right-hand side surface 101c of the top cover 70. As shown in FIG. 2B, a fan mechanism 45 is provided at the outlet 73. By operating the fan mechanism 45, external air is sucked in from the inlet 71 as cooling air and supplied to the inside of the image display apparatus 20. The air that has cooled the inside of the image display apparatus 20 and has become warm is discharged outside from the outlet 73.

Figure 3:
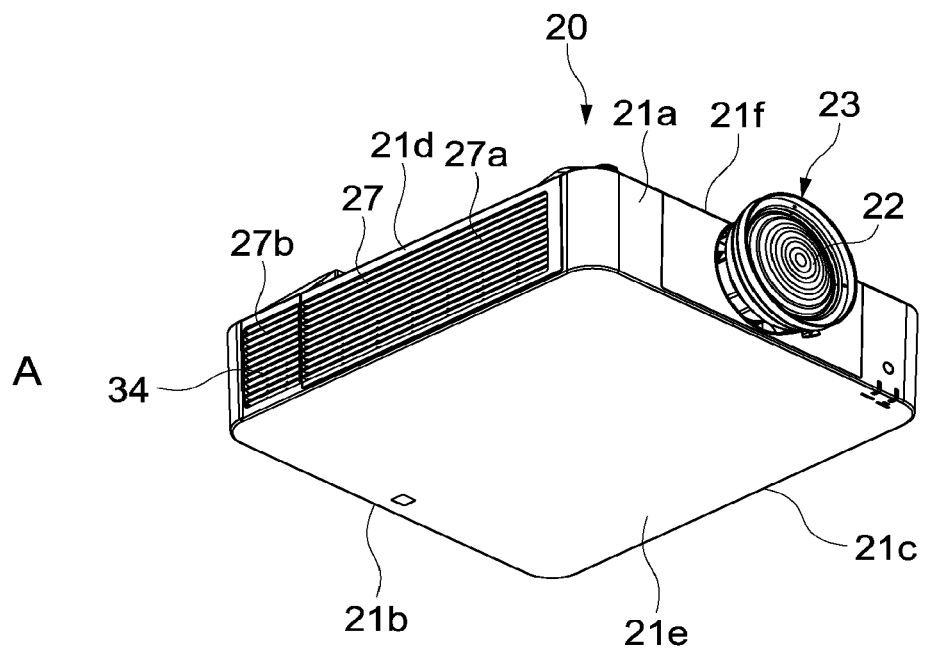
FIG. 3 Schematic diagrams showing a configuration example of an image display apparatus.
Figure 3:
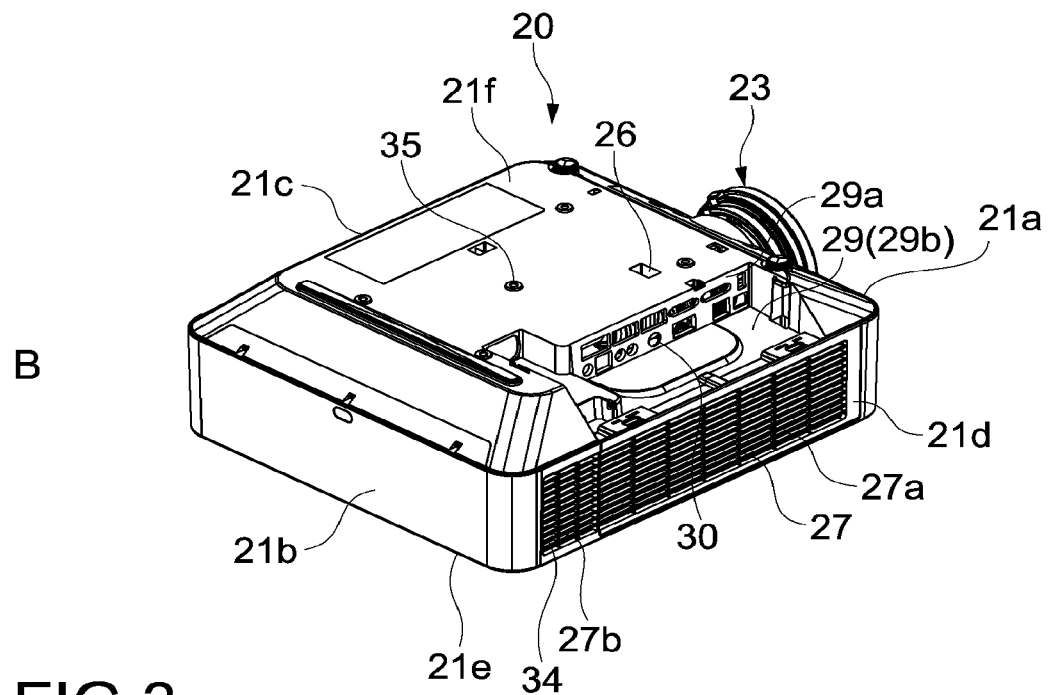

FIG. 3 are schematic diagrams showing a configuration example of the image display apparatus 20. The image display apparatus 20 is a projector used for presentations, digital cinema, and various other purposes, for example. The present technology is also applicable to other image display apparatuses.

The image display apparatus 20 can be used alone without attaching the dustproof apparatus 10. Further, the image display apparatus 20 is designed to be tilt-free and can be used upside down. For example, in a case where the image display apparatus 20 is set on the ceiling 1, the image display apparatus 20 is used upside down. Also in a case where the image display apparatus 20 is set on the ceiling 1 together with the dustproof apparatus 10 as in this embodiment, the image display apparatus 20 is used upside down.

Respective surfaces of the image display apparatus 20 will be referred to as a front surface 21a, a rear surface 21b, a right-hand side surface 21c, a left-hand side surface 21d, a lower surface 21e, and a setting surface 21f while using a state where the image display apparatus 20 is set on the ceiling 1 as a reference. At a center portion of the front surface 21a, a projection unit 23 including a projection lens 22 for projecting an image is set. Further, screw holes 35 for connecting with a connection metal fitting 51 provided on the base portion 40 and an attachment hole 26 for engaging with a guide metal fitting 56 of the base portion 40 are formed substantially at the center of the setting surface 21f.

On the left-hand side surface 21d, an inlet 27 for sucking air into the image display apparatus 20 is provided. On the right-hand side surface 21c, an outlet 28 (see FIG. 2B) for discharging warmed air is provided. A filter (not shown) is provided in the inlet 27, and a fan mechanism (not shown) is provided in the outlet 28.

As shown in FIG. 3B, a concave portion 29 is formed from the center of the setting surface 21f to the left-hand side surface 21d, and a plurality of terminals 30 to which a power cable, a DVI terminal cable or an HDMI (registered trademark) terminal cable, and the like are connectable are provided on a side surface 29a of the concave portion 29. It should be noted that in the figures, only holes into which terminals are to be inserted are shown, and the holes are denoted as the terminals 30.

A rear side (right-hand side surface 21c side) of the side surface 29a of the concave portion 29 and a lower side (lower surface 21e side) of a bottom surface 29b of the concave portion 29 become the internal space of the image display apparatus 20. The bottom surface 29b is connected to an upper portion side of the inlet 27, and air that passes through the inlet 27 passes below the bottom surface 29b and travels inside the image display apparatus 20.

The image display apparatus 20 includes therein, for example, a light source unit including a laser light source and the like, an illumination optical system, light modulation devices such as a liquid crystal panel (both of which are not shown), the projection unit 23, and the like. The light source unit generates white light and emits it to the illumination optical system. The illumination optical system splits the white light into respective color light of RGB and guides the light to the light modulation devices for the respective colors. The light modulation devices modulate the respective color light of RGB on the basis of image information input from outside.

Modulated light (image light) of the respective colors is synthesized by a dichroic prism or the like included in the illumination optical system and emitted to the projection unit 23. The projection unit 23 projects the synthesized image light onto a screen or the like via the projection lens 22 and the like. As a result, a color image is generated. Specific configurations of the light source unit, the illumination optical system, and the like are not limited. Further, other configurations for generating an image may also be used.

In this embodiment, the optical system from the light source to the projection lens 22 is accommodated in a predetermined area inside the image display apparatus 20. This area is surrounded by a casing structure (not shown) so that dust or the like does not enter an optical path. On the other hand, a cooling unit such as a heatsink for cooling heat generated by the light source is arranged at a position behind the light source unit in an area spatially separated from that area. In a case where a laser light source is used, high luminance can be realized, but heat processing becomes important. In other words, it is important to efficiently cool the heat of the cooling unit that cools the light source.

As shown in FIGS. 3A and 3B, the inlet 27 includes a first supply port 27a for supplying air to the optical system and a second supply port 27b for supplying air to the cooling unit. Substantially the center portion of the left-hand side surface 21d becomes the first supply port 27a, and a rear side portion becomes the second supply port 27b. It can also be said that the inlet 27 is divided into the first and second supply ports 27a and 27b.

The first supply port 27a communicates with an area accommodating the optical system. When dust or the like enters the optical system, a problem such as lowering of luminance highly likely occurs, so it is necessary to supply clean air to this area. Therefore, a filter (not shown) is provided at the first supply port 27a. Cooling air supplied to the optical system is discharged from a discharge-side flow channel hole provided in the vicinity of the fan mechanism and discharged from the outlet 28 (first outlet 28a) as it is.

Meanwhile, air containing dust may be supplied to the cooling unit such as a heatsink. This is because this air does not enter the area accommodating the optical system. Therefore, no filter is provided at the second supply port 27b, and eave-like vanes 34 are fixed. Since no filter is provided, a flow rate of air that flows in from the second supply port 27b is not restricted. As a result, the cooling air can be supplied at a high flow rate, and the cooling unit can be cooled efficiently. The air supplied from the second supply port 27b is discharged from the outlet 28 (first outlet 28a) by the fan mechanism.

As shown in FIG. 2B, the first outlet 28a and a second outlet 28b are provided at the outlet 28. The first outlet 28a is provided for discharging air supplied from the first supply port 27a to the optical system. Further, the second outlet 28b is provided for discharging air supplied from the second supply port 27b to the cooling unit.

It should be noted that if the air supplied to the cooling unit does not flow back to the optical system, the flow channel does not need to be completely divided toward the first and second outlets 28a and 28b. The first outlet 28a is mainly provided for discharging air supplied to the optical system, and the second outlet 28b is mainly provided for discharging air supplied to the cooling unit.

When the image display apparatus 20 is driven, heat is generated inside the image display apparatus 20. Therefore, a temperature of air discharged from the outlet 28 becomes higher than a temperature of air sucked in from the inlet 27. That temperature difference becomes large regarding the air supplied to the cooling unit that cools the light source unit in particular. In other words, the temperature difference between the temperature of air sucked into the second supply port 27b and the temperature of air discharged from the second outlet 28b becomes large. Therefore, by measuring this temperature difference, it becomes possible to accurately detect a driving state of the image display apparatus 20. This point will be described later in detail.

Figure 4:
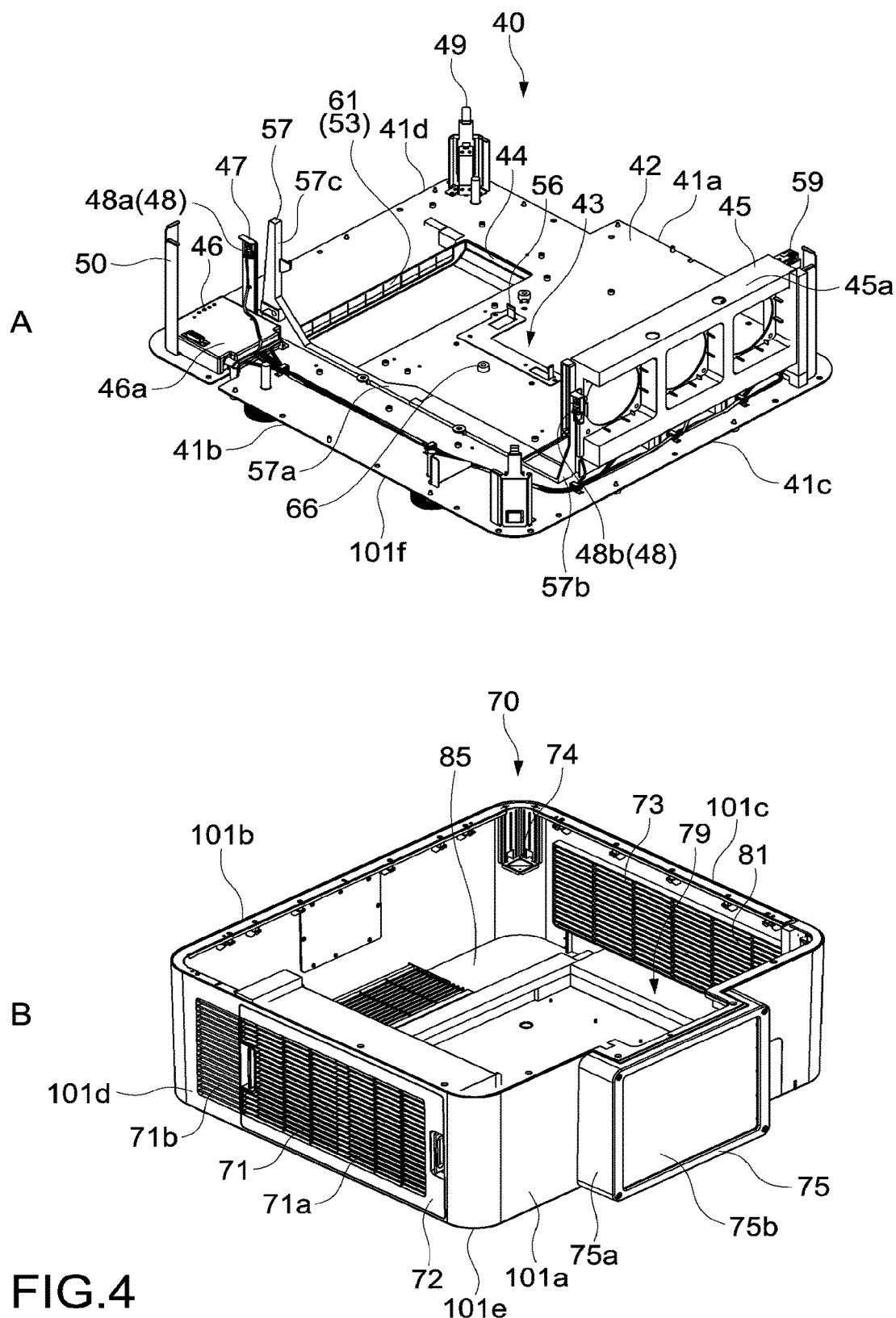
FIG. 4 Diagrams respectively showing configuration examples of a base portion and the top cover of the dustproof apparatus.

FIG. 4 are diagrams respectively showing configuration examples of the base portion 40 and top cover 70 of the dustproof apparatus 10. The base portion 40 shown in FIG. 4A is illustrated such that the support surface 42 supporting the image display apparatus 20 faces upward.

As shown in FIG. 4A, the base portion 40 has a substantially rectangular shape when viewed from the height direction, and a metal material such as aluminum, for example, is used as a material thereof. 4 side portions surrounding the base portion 40 will be referred to as a front side portion 41a, a rear side portion 41b, a right-hand side portion 41c, and a left-hand side portion 41d in accordance with the names of the respective surfaces of the top cover 70.

On the support surface 42 side of the base portion 40, a holding mechanism 43 that holds the image display apparatus 20, an opening 44, a fan mechanism 45, a control unit 46, a sensor holding portion 47, a sensor unit 48, a temporary-fixing mechanism 49, guide plates 50, and an air separation portion 57 are provided. On the setting surface 101f side shown in FIG. 1B, the connection metal fitting 51 that is to be connected to a ceiling hanger metal fitting (not shown), the opening cover 52 that covers the opening 44 from the outer side, and an AC adapter 55 are provided.

The holding mechanism 43 includes the connection metal fitting 51 provided on the setting surface 101f side and the guide metal fitting 56 provided at substantially the center of the support surface 42. As shown in FIG. 1B, bosses 66 each having a screw hole formed therein are provided at respective apex positions of a triangle of the connection metal fitting 51. As shown in FIG. 4A, when the connection metal fitting 51 is set, the bosses 66 penetrate and protrude from the support surface 42.

By positioning the bosses 66 with the screw holes 35 shown in FIG. 3B and screwing them, the image display apparatus 20 is attached to the base portion 40. By screwing at 3 points positioned at the respective apexes of the triangle, it becomes possible to stably hold the image display apparatus 20. The guide metal fitting 56 is a guide component used when assembling the base portion 40 and the image display apparatus 20.

The air separation portion 57 has a substantially U shape and includes a bottom-surface separation portion 57a provided along the rear side portion 41b and two side-surface separation portions 57b and 57c extending vertically from both ends thereof. In this embodiment, the air separation portion 57 functions as a part of a division portion, but this point will be described later in detail.

The air separation portion 57 is formed of, for example, a general-purpose resin such as an ABS (acrylonitrile butadiene styrene) resin, engineering plastic such as a PC (polycarbonate) resin and a mixed resin of ABS and PC, or the like. Without limiting to these, a metal material such as aluminum may also be used, for example.

Figure 6:
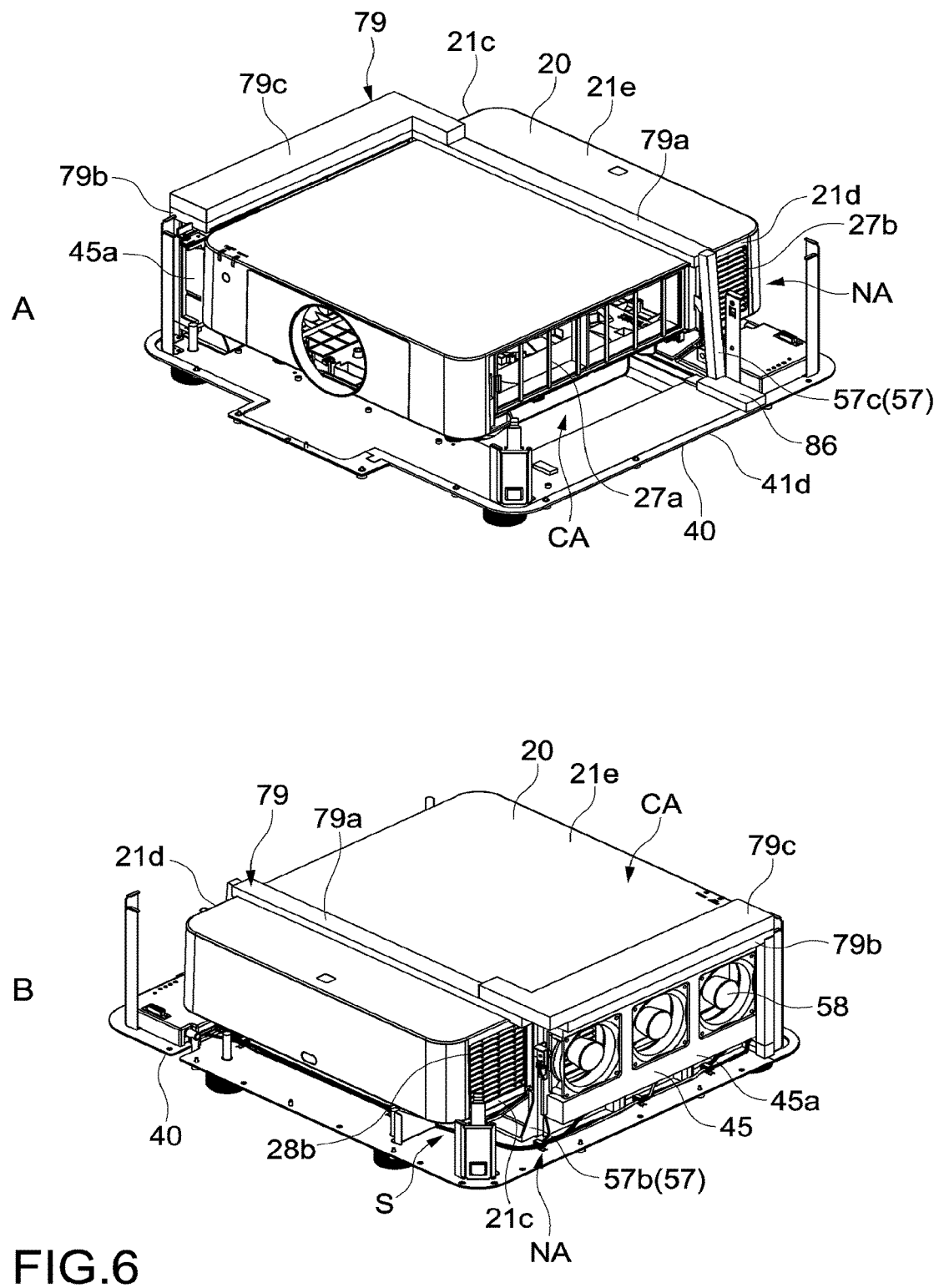
FIG. 6 Schematic diagrams showing a configuration example of a divisional cushion portion.

The air separation portion 57 holds a rear-side portion of the image display apparatus 20 (see FIG. 6 etc.). At this time, a gap between the air separation portion 57 and the image display apparatus 20 is hermetically sealed by a cushion member made of sponge, urethane, or the like. An elastic member such as rubber may be used as the sealing member instead of the cushion member.

The fan mechanism 45 is provided along the right-hand side portion 41c and includes a fan holding portion 45a and 3 fans 58 (see FIG. 6B). The fan holding portion 45a is erected vertically from the support surface 42 on the front side of the right-hand side-surface separation portion 57b of the air separation portion 57. The fan holding portion 45a is formed of a resin material (plastic) such as ABS, a metal material, or the like. The fan mechanism 45 corresponds to a fan portion in this embodiment.

As shown in FIG. 2B, the fan mechanism 45 is formed between the outlet 73 formed in the top cover 70 and the first outlet 28a of the image display apparatus 20. In other words, the fan mechanism 45 is provided so as to cover the first outlet 28a from which air supplied to the optical system is discharged, out of the outlet 28 of the image display apparatus 20.

Therefore, the air supplied to the optical system is sucked into the fan mechanism 45 from the first outlet 28a and discharged outside from the outlet 73 via the fan mechanism 45. On the other hand, air supplied to the cooling unit proceeds from the second outlet 28b to the outlet 73 without passing through the fan mechanism 45 and is discharged outside. An area S on a rear side of a rear end portion of the fan holding portion 45a shown in FIG. 2B is an area deviated from a flow channel of air sucked into the fan mechanism 45.

As shown in FIG. 4A, cables that are connected to the respective fans are wired to the control unit 46 from a lower side of the fan holding portion 45a. Further, on the front side of the fan holding portion 45a, an LED 59 serving as an indicator that indicates a driving state of the fans 58 is provided. A cable is also wired from the LED 59 toward the control unit 46.

The control unit 46 is formed at a corner between the rear side portion 41b and the left-hand side portion 42d. The control unit 46 is arranged in a space on the rear side of the left-hand side-surface separation portion 57c of the air separation portion 57. The control unit 46 includes a cover 46a and a substrate (not shown) accommodated in the cover. A control circuit or the like that controls a power supply circuit, the fans 58, the LED 59, and the like is formed on the substrate.

These circuits are realized by, for example, a microcomputer in which a predetermined IC (integrated circuit), a CPU, memories (RAM, ROM), I/O, and the like are mounted on one chip. Further, PLD (Programmable Logic Device) such as FPGA (Field Programmable Gate Array) or other devices such as ASIC (Application Specific Integrated Circuit) may also be used.

The AC adapter 55 shown in FIG. 1B, that is provided on the setting surface 101*f*, is connected to the control unit 46. An outlet cable (not shown) is connected to the AC adapter 55 and is also connected to an outlet set on the ceiling 1 or the like. The control unit 46 receives electric power via the AC adapter 55 and executes various operations.

The sensor unit 48 includes a first temperature sensor 48*a* provided in the vicinity of the left-hand side portion 41*d* and a second temperature sensor 48*b* provided in the vicinity of the right-hand side portion 41*c*. As each of the temperature sensors, an arbitrary temperature sensor including well-known temperature sensors may be used. Further, the same temperature sensor may be used as the first and second temperature sensors 48*a* and 48*b*, or different types of temperature sensors may be used.

As shown in FIG. 4A, on the rear side of the left-hand side portion 41*d*, a plate-like sensor holding portion 47 is provided adjacent to the control unit 46. The first temperature sensor 48*a* is provided at a tip end of the sensor holding portion 47 that is erected vertically. Meanwhile, the second temperature sensor 48*b* is provided on the fan holding portion 45*a* on the rear side of the right-hand side portion 41*c*. When viewed from the support surface 42, the first and second temperature sensors 48*a* and 48*b* are set at heights substantially equal to each other. Of course, the present technology is not limited to this, and the setting positions may be varied depending on temperature sensitivities. Cables are wired from the respective temperature sensors 48*a* and 48*b* toward the control unit 46.

As a control method according to the present technology, the control unit 46 controls drive of the fans 58 of the fan mechanism 45 on the basis of measurement values obtained by the first and second temperature sensors 48*a* and 48*b*. The control method will be described later in detail.

The opening 44 is formed for drawing out a power cable and the like to be connected to the image display apparatus 20 to the outside. By the opening 44 being covered by the opening cover 52, a drawing port 61 for drawing out the power cable and the like is formed. At the drawing port 61, a dustproof structure portion 53 formed of a sponge or the like is provided so as to prevent external dust or the like from entering.

The guide plates 50 are respectively provided at a corner between the rear side portion 41*b* and the left-hand side portion 41*d* and a corner between the front side portion 41*a* and the right-hand side portion 41*c*, which is a diagonally-opposite position. When attaching the top cover 70 to the base portion 40, the mutual positional relationship is guided by the guide plates 50. Also, a strength of the top cover 70 is reinforced.

The temporary-fixing mechanisms 49 are respectively provided at a corner between the front side portion 41*a* and the left-hand side portion 41*d* and a corner between the rear side portion 41*b* and the right-hand side portion 41*c*, which is a diagonally-opposite position. The temporary-fixing mechanisms 49 function when attaching the top cover 70 to the base portion 40 set on the ceiling 1 in a state where the image display apparatus 20 is held. In other words, the temporary-fixing mechanisms 49 temporarily fix the top cover 70 so as to prevent it from falling during attachment.

Figure 5:
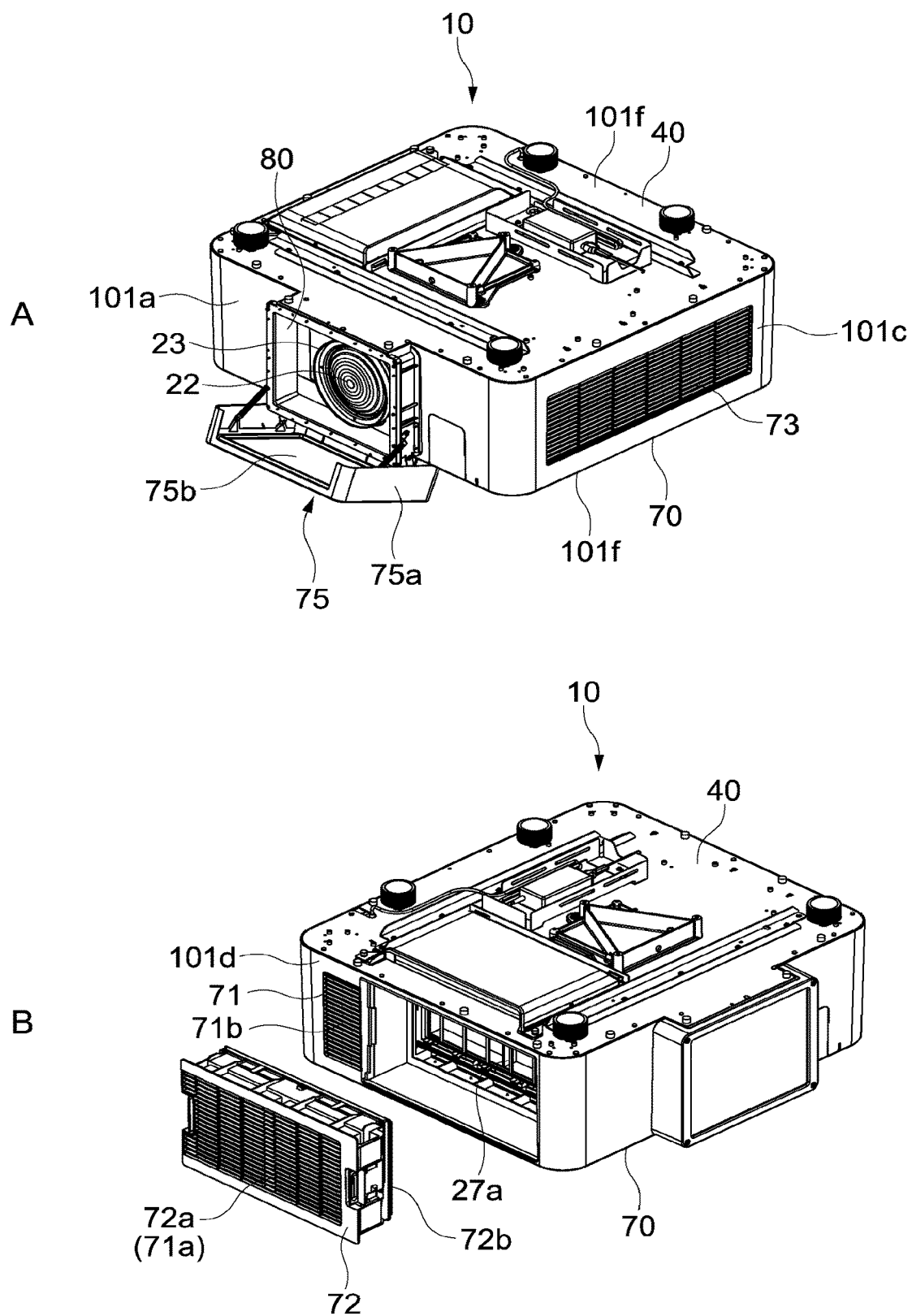
FIG. 5 Schematic diagrams showing a configuration example of the top cover.

With reference to FIGS. 4B and 5, the top cover 70 will be described. The top cover 70 includes the inlet 71, a filter block 72, the outlet 73, engagement portions 74, a front cover 75, and a divisional cushion portion 79.

The top cover 70 is formed of, for example, a general-purpose resin such as an ABS resin, engineering plastic such as a PC resin and a mixed resin of ABS and PC, or the like. By using the resin material, the weight of the top cover 70 can be reduced. Of course, other materials may also be used.

The front cover 75 is provided at a center portion of the front surface portion 101*a* so as to cover the projection lens 22 (projection unit 23) of the image display apparatus 20. The front cover 75 includes a frame portion 75*a* and a translucent cover 75*b* formed of glass or the like, for example, for hermetically sealing an opening portion formed by the frame portion 75*a*. Image light projected from the projection lens 22 is projected onto a screen or the like via the translucent cover 75*b*.

As shown in FIG. 5A, the front cover 75 is provided so as to be openable/closable with respect to the front surface 101*a*. An opening 80 is formed at a central portion of the front surface 101*a*, and the front cover 75 is configured to hermetically seal the opening 80. In the opened state shown in FIG. 5A, it is possible to access the projection unit 23 from outside via the opening 80. Accordingly, it becomes possible to easily perform a manual focus adjustment, replacement of the projection lens 22, and the like, for example, without removing the dustproof apparatus 10.

The outlet 73 is formed across substantially an entire area of the right-hand side surface 101*c*. The outlet 73 is provided so as to face the fan mechanism 45 provided on the base portion 40. The outlet 73 is provided in the same direction as the outlet 28 of the image display apparatus 20 held by the base portion 40, that is, on the right-hand side. Air discharged from the outlet 28 of the image display apparatus 20 is discharged from the outlet 73 of the top cover 70 to the outside. As shown in FIG. 4B, the eave-shaped vanes 81 are attached to the outlet 73.

The inlet 71 is formed across substantially an entire area of the left-hand side surface 101*d*. As shown in FIG. 5B, the filter block 72 is detachably attached to the left-hand side surface 101*d*. When the filter block 72 is attached to the left-hand side surface 101*d*, a suction port 72*a* of the filter block 72 becomes a part of the inlet 71. In this embodiment, a portion of the suction port 72*a* of the filter block 72 becomes a first suction area 71*a* of the inlet 71. Meanwhile, a portion fixedly formed on a rear side of the left-hand side surface 101*d* becomes a second suction area 71*b* of the inlet 71.

When the filter block 72 is attached, the first suction area 71*a* and the first supply port 27*a* shown in FIG. 3 oppose each other, and a discharge port 72*b* of the filter block 72 come into communication with the first supply port 27*a*. The air sucked in from the first suction area 71*a* is supplied to the optical system including the light source via the first supply port 27*a*.

Inside the filter block 72, two filters each including a filter portion constituted of folded filter paper are accommodated while being laminated on top of each other, for example. As a result, clean air from which dust or the like has been sufficiently removed can be supplied to the optical system. It should be noted that the configuration of the filters is not limited, and a sponge type or a charge type may be used. The filters accommodated in the filter block 72 correspond to a filter portion in this embodiment.

The second suction area 71*b* opposes the second supply port 27*b* shown in FIG. 3. Since no filter is provided in the second suction area 71b, a flow rate of air that flows in from the second suction area 71b is not restricted. Therefore, it becomes possible to swiftly supply cooling air to the cooling unit such as a heatsink via the second suction area 71b and the second supply port 27b. As a result, the cooling unit can be cooled efficiently.

The engagement portions 74 are portions that engage with the temporary-fixing mechanisms 49 provided on the base portion 40. The engagement portions 74 at respectively provided at a corner between the front surface 101a and the left-hand side surface 101d in the top cover 70 and a corner between the rear surface 101b and the right-hand side surface 101c, which is a diagonally-opposite position.

Due to the temporary-fixing mechanisms 49 provided in the base portion 40 and the engagement portions 74 provided in the top cover 70, the temporary fixation is made possible in this embodiment. Accordingly, it becomes possible to safely attach the top cover 70 while preventing it from falling when attaching the top cover 70 to the base portion 40 in a state where the image display apparatus 20 is held. As a result, high workability can be exerted regarding the attachment to the ceiling 1.

Figure 7:
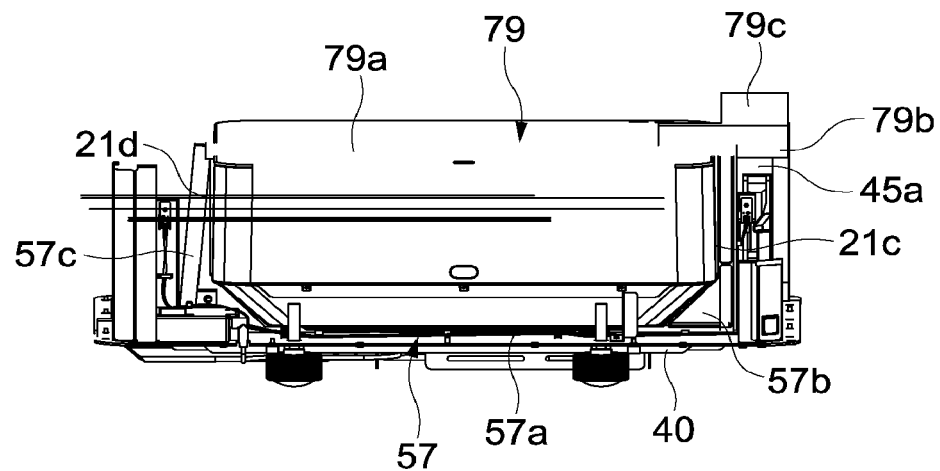
FIG. 7 A schematic diagram showing a configuration example of the divisional cushion portion.
Figure 8:
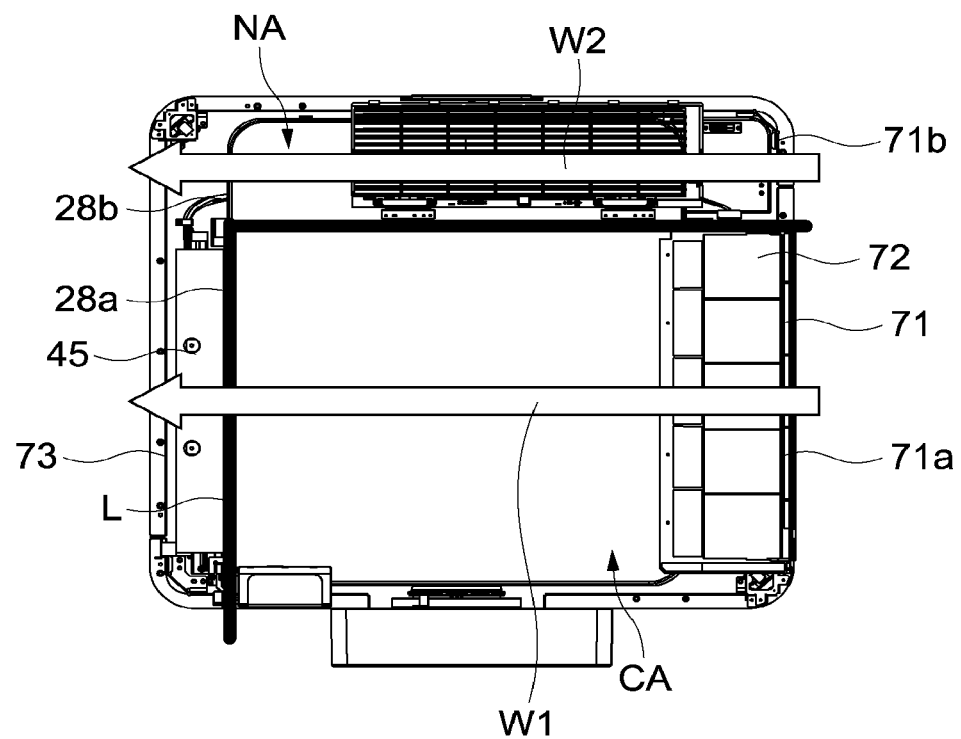
FIG. 8 A schematic diagram showing a configuration example of the divisional cushion portion.

FIGS. 6 to 8 are diagrams for explaining the divisional cushion portion 79. As shown in FIG. 4B, the divisional cushion portion 79 is provided on the inner surface 85 of the top cover 70. When the top cover 70 is attached so as to cover the image display apparatus 20 held by the base portion 40, the divisional cushion portion 79 adheres tightly to the lower surface 21e of the image display apparatus 20 and the fan holding portion 45a as shown in FIGS. 6 and 7.

As shown in FIGS. 6 and 7, the divisional cushion portion 79 includes first to third cushion members 79a to 79c. The first cushion member 79a adheres tightly to the rear side of the lower surface 21e of the image display apparatus 20 fully across from the left-hand side surface 21d to the right-hand side surface 21c.

The second cushion member 79b adheres tightly to an entire upper surface (lower side at time of setting) of the fan holding portion 45a. The third cushion member 79c has a substantially L shape and is superimposed on an entire area on the second cushion member 79b and a left-end area of the first cushion member 79a. The area of the first cushion member 79a excluding the left-end area and the entire area of the third cushion member 79c are portions that come into contact with the inner surface 85 of the top cover 70.

Similar to the air separation portion 57 described above, the divisional cushion portion 79 functions as a part of the division portion in this embodiment. As shown in FIG. 8, the division portion includes a function of dividing the internal space into a clean air area CA as a first area and a normal air area NA as a second area. In FIG. 8, a boundary between both areas is represented by an L-shaped line L. An area surrounded by the line L including a large portion of the image display apparatus 20 becomes the clean air area CA. An area outside the line L becomes the normal air area NA. It should be noted that the clean air area CA and the normal air area NA are spatially separated by holding the image display apparatus 20 on the base portion 40 and attaching the top cover 70.

As shown in FIGS. 6 and 7, the rear-side portion of the image display apparatus 20 is provided in the air separation portion 57. As shown in FIG. 6A, in the image display apparatus 20, the left-hand side-surface separation portion 57c of the air separation portion 57 is positioned at the boundary between the first and second supply ports 27a and 27b. As shown in FIG. 7, when viewed from the rear, the image display apparatus 20 and the air separation portion 57 adhere tightly to each other without a gap by the cushion members provided therebetween.

The front side of the side-surface separation portion 57c shown in FIG. 6A becomes the clean air area CA, and the rear side thereof becomes the normal air area NA. In other words, the division portion divides the internal space into the two areas such that the first supply port 27a is included in the clean air area CA and the second supply port 27b is included in the normal air area NA.

It should be noted that since the filter block 72 is arranged in the vicinity of the left-hand side portion 41d on the front side of the side-surface separation portion 57c and in the space between the side-surface separation portion 57c and the left-hand side portion 41d, the clean air area CA and the normal air area NA are separated appropriately. It should be noted that a cushion member 86 for the division into both areas is provided from a root portion of the side-surface separation portion 57c to the left-hand side portion 41d.

As shown in FIG. 6B, the right-hand side-surface separation portion 57b of the air separation portion 57 is positioned at a boundary between the first outlet 28a and the second outlet 28b (only second outlet 28b is shown). An area on the front side of the right-hand side-surface separation portion 57b shown in FIG. 9B and on an inner side of the fan mechanism 45 becomes the clean air area CA. An area on the rear side of the side-surface separation portion 57b (area S) between the fan mechanism 45 and the outlet 73 becomes the normal air area NA.

Therefore, the division portion divides both areas such that the first outlet 28a is included in the clean air area CA and the second outlet 28b is included in the normal air area NA. It should be noted that since the fans 58 operate, dust or the like does not flow backward and enter the clean air area CA.

As shown in FIG. 7, when the top cover 70 is attached, the periphery of the image display apparatus 20 is surrounded by the left- and right-hand side-surface separation portions 57c and 57b, the bottom-surface separation portion 57a, and the first cushion member 79a. By these members, the clean air area CA and the normal air area NA are separated appropriately.

In this embodiment, parts of the cushion member 86, the fan mechanism 45, and the filter block 72 shown in FIG. 6A also function as the division portion.

As shown in FIG. 8, in the clean air area CA, clean air W1 from which dust or the like has been removed by the filter block 72 is sucked in and supplied to the optical system via the first supply port 27a. Air W2 having a high flow rate is supplied to the normal air area NA via the second suction area 71b, and thus the cooling unit is cooled efficiently. By limiting the area to which clean air is to be supplied in this way and dividing the internal space into that area and the area to which normal air can be supplied without a problem, it becomes possible to reduce a load on the filter portion in the filter block 72. In other words, it becomes possible to miniaturize the filter portion 84 (filter block 72) and reduce component costs. Further, it also becomes possible to prolong a lifetime of the filter portion.

[Control Method for Fan Mechanism]

Figure 9:
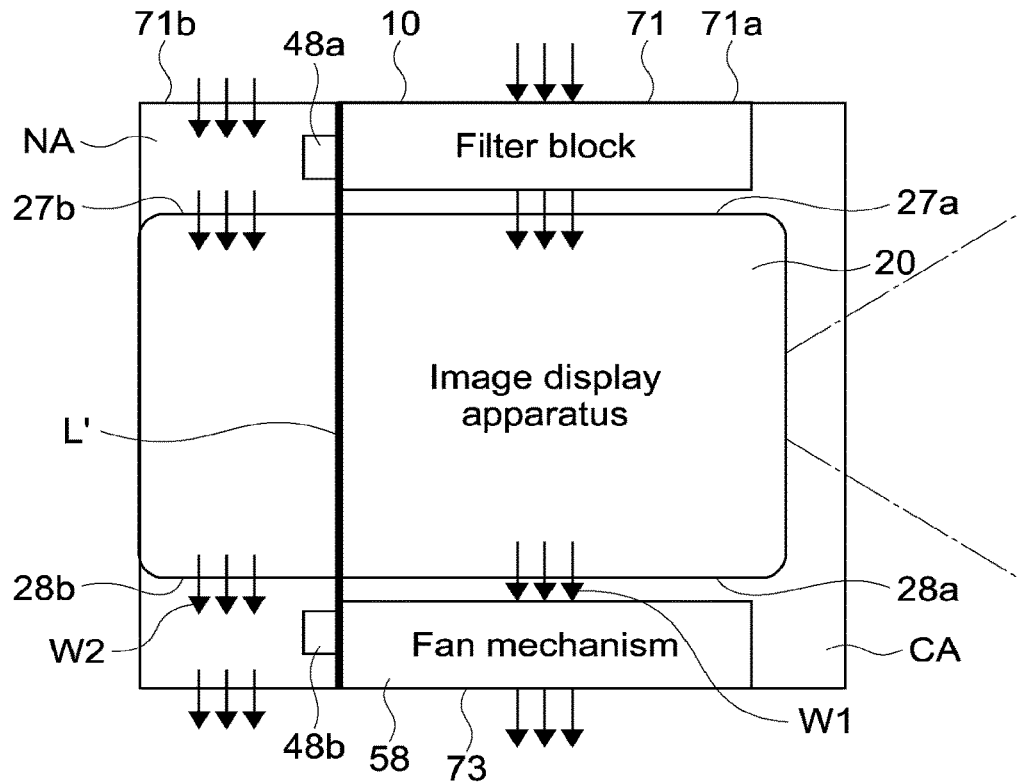
FIG. 9 A diagram showing a simplified configuration of the dustproof apparatus.
Figure 10:
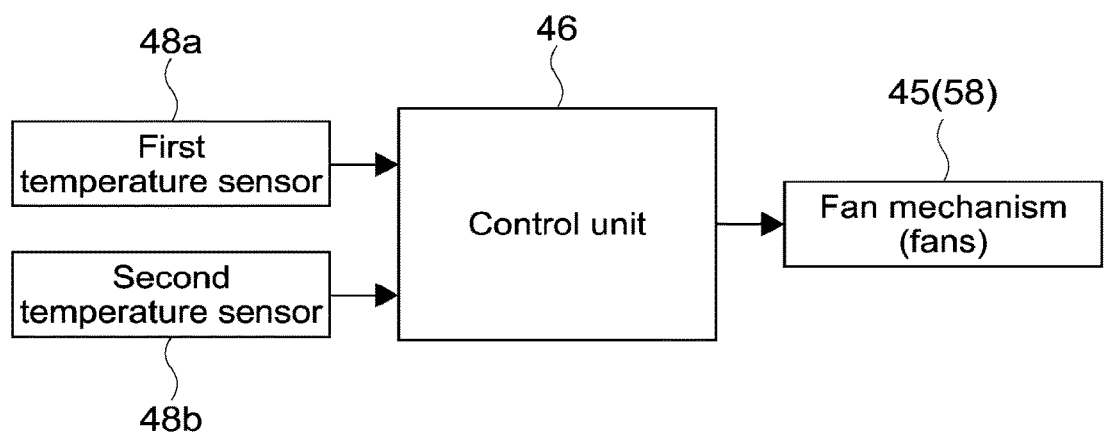
FIG. 10 A block diagram showing a functional configuration example for realizing a control method of the present technology.

Regarding control of the fan mechanism 45 by the control unit 46, a plurality of control methods according to the present technology will be described. FIG. 9 is a diagram showing a simplified configuration of the dustproof apparatus 10. In FIG. 9, a boundary between the clean air area CA and the normal air area NA is expressed by a straight line L'. FIG. 10 is a block diagram showing a functional configuration example for realizing the control method according to the present technology.

As shown in FIG. 9, both the first and second temperature sensors 48a and 48b are provided in the normal air area NA. The first temperature sensor 48a is provided between the second suction area 71b of the inlet 71 of the top cover 70 and the second supply port 27b of the image display apparatus 20. The first temperature sensor 48a measures a first temperature which is a temperature in the vicinity of the inlet 71. In this embodiment, a temperature of air that enters the second supply port 27b, that is, an intake temperature with respect to the area where the cooling unit is provided, is measured as the first temperature.

The second temperature sensor 48b is provided between the outlet 73 of the top cover 70 and the second outlet 28b of the image display apparatus 20. The second temperature sensor 48b measures a second temperature which is a temperature in the vicinity of the outlet 73. In this embodiment, a temperature of air discharged from the second outlet 28b, that is, an exhaust temperature from the area where the cooling unit is provided, is measured as the second temperature.

As shown in FIG. 10, the control unit 46 controls drive of the fans 58 of the fan mechanism 45 on the basis of measurement values of the first and second temperatures output from the first and second temperature sensors 48a and 48b. For example, the control unit 46 outputs a predetermined driving current to the fans 58. Outputs of the measurement values from the first and second temperature sensors 48a and 48b are executed at predetermined intervals. The predetermined intervals are not limited, and the respective measurement values are output to the control unit 46 at intervals of 2 seconds, for example.

(First Control Method)

A first control method for driving the fans 58 will be described. In the first control method, the drive of the fans 58 is controlled on the basis of a temperature difference Δt (° C.) between the first temperature and the second temperature. Specifically, in a case where the temperature difference Δt is equal to or larger than a first threshold value as a predetermined threshold value, the drive of the fans 58 is started. Further, in a case where the temperature difference Δt is smaller than the first threshold value, the drive of the fans 58 is stopped. It should be noted that the temperature difference Δt is calculated by "second temperature (exhaust temperature)−first temperature (intake temperature)".

Figure 11:
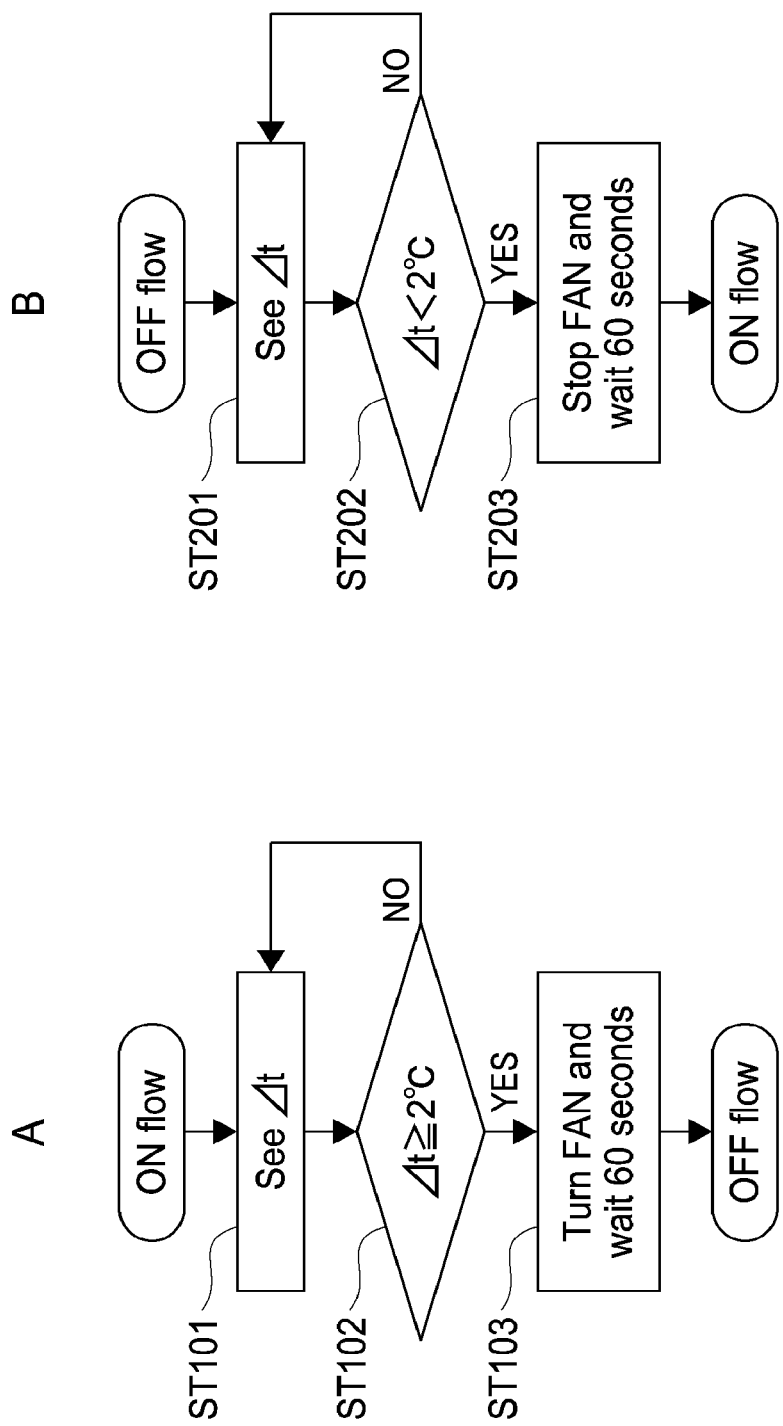
FIG. 11 Flowcharts showing an example of a first control method.

FIG. 11 are flowcharts showing an example of the first control method. The ON flow shown in FIG. 11A is a flowchart for starting drive of the fans 58 that are being stopped. The OFF flow shown in FIG. 11B is a flowchart for stopping the drive of the driven fans 58. The driving state of the fans 58 can be detected by the control unit 46.

As shown in FIG. 11A, the control unit 46 calculates the temperature difference Δt in a state where the fans 58 are stopped (Step 101). It is judged whether or not the temperature difference Δt is equal to or larger than 2° C. set as the first threshold value (Step 102). It should be noted that the first threshold value is not limited to 2° C. and may be set as appropriate.

In a case where the temperature difference Δt is not equal to or larger than 2° C. (No in Step 102), the processing returns to Step 101, and Δt is monitored at predetermined intervals. The predetermined intervals are not limited and may be set to coincide with output intervals (measurement intervals) of the measurement values from the first and second temperature sensors 48a and 48b, for example.

In a case where the temperature difference Δt is equal to or larger than 2° C. (Yes in Step 102), the drive of the fans 58 is started, and after waiting for 60 seconds, the processing shifts to the OFF flow shown in FIG. 11B (Step 103).

As shown in FIG. 11B, the temperature difference Δt is calculated in a state where the fans 58 are driven (Step 201). It is judged whether or not the temperature difference Δt is smaller than 2° C. as the first threshold value (Step 202). In a case where the temperature difference Δt is not smaller than 2° C. (No in Step 202), the processing returns to Step 201, and the temperature difference Δt is monitored.

In a case where the temperature difference Δt is smaller than 2° C. (Yes in Step 202), the drive of the fans 58 is stopped, and after waiting for 60 seconds, the processing shifts to the ON flow shown in FIG. 11A (Step 203).

In this way, in the first control method, the drive of the fans 58 is controlled on the basis of the temperature difference Δt between the first temperature in the vicinity of the inlet 71 and the second temperature in the vicinity of the outlet 73. Accordingly, it becomes possible to appropriately control the fans 58 in accordance with the drive of the image display apparatus 20 so as to prevent the fans 58 from being wastefully driven unnecessarily. As a result, power consumption can be saved, and noises can be prevented from being generated.

Further, by monitoring the temperature difference Δt, it is possible to judge the driving state of the image display apparatus 20 even when the control unit 46 and the image display apparatus 20 are not electrically connected. As a result, it becomes possible to omit a mechanism for connecting the control unit 46 and the image display apparatus 20, and the like and suppress costs. Further, it also becomes possible to omit connection tasks and thus improve workability regarding the attachment of the dustproof apparatus 10.

In this embodiment, regarding the air supplied to the cooling unit, the difference between the intake temperature and the exhaust temperature is calculated as the temperature difference Δt. Accordingly, the driving state of the image display apparatus 20 can be detected accurately. In other words, the temperature difference Δt generated in accordance with the drive of the image display apparatus 20 can be detected highly accurately. As a result, the fans 58 can be controlled accurately in accordance with the drive of the image display apparatus 20.

Further, as shown in FIG. 9, the second temperature sensor 48b is provided at a position deviated from the flow channel of air sucked into the fans 58. Accordingly, it becomes possible to stably and accurately measure the second temperature without being influenced by the drive of the fans 58.

It should be noted that in Steps 103 and 203 in the figure, a standby time of 60 seconds is set. Accordingly, it becomes possible to prevent chattering due to a fluctuation in the temperature measurement by the first and second sensors 48a and 48b. Specifically, due to the measurement result of the temperature difference Δt fluctuating in the vicinity of 2° C. as the first threshold value, the start and stop of the drive of the fans 58 can be prevented from being repeated at short intervals. As a result, unnecessary consumption of electric power can be suppressed, and an uncomfortable feeling due to noises can be suppressed. It should be noted that the standby time is not limited and may be set as appropriate.

For preventing chattering of the fans 58, a margin for preventing chattering may be set as the first threshold value. In other words, the first threshold may be set to have a width. For example, in Step 102 shown in FIG. 11A, a judgment may be made on whether or not the temperature difference Δt is equal to or larger than 2.1° C. Alternatively, in Step 202 shown in FIG. 11B, a judgment may be made on whether or not the temperature difference Δt is smaller than 1.9° C. Accordingly, the repetition of ON and OFF of the fans 58 can be prevented from occurring. It should be noted that the margin for preventing chattering is not limited to 0.1° C. and may be set as appropriate.

(Second Control Method)

A second control method for driving the fans 58 will be described. In the second control method, the OFF flow differs from that of the first control method.

Figure 12:
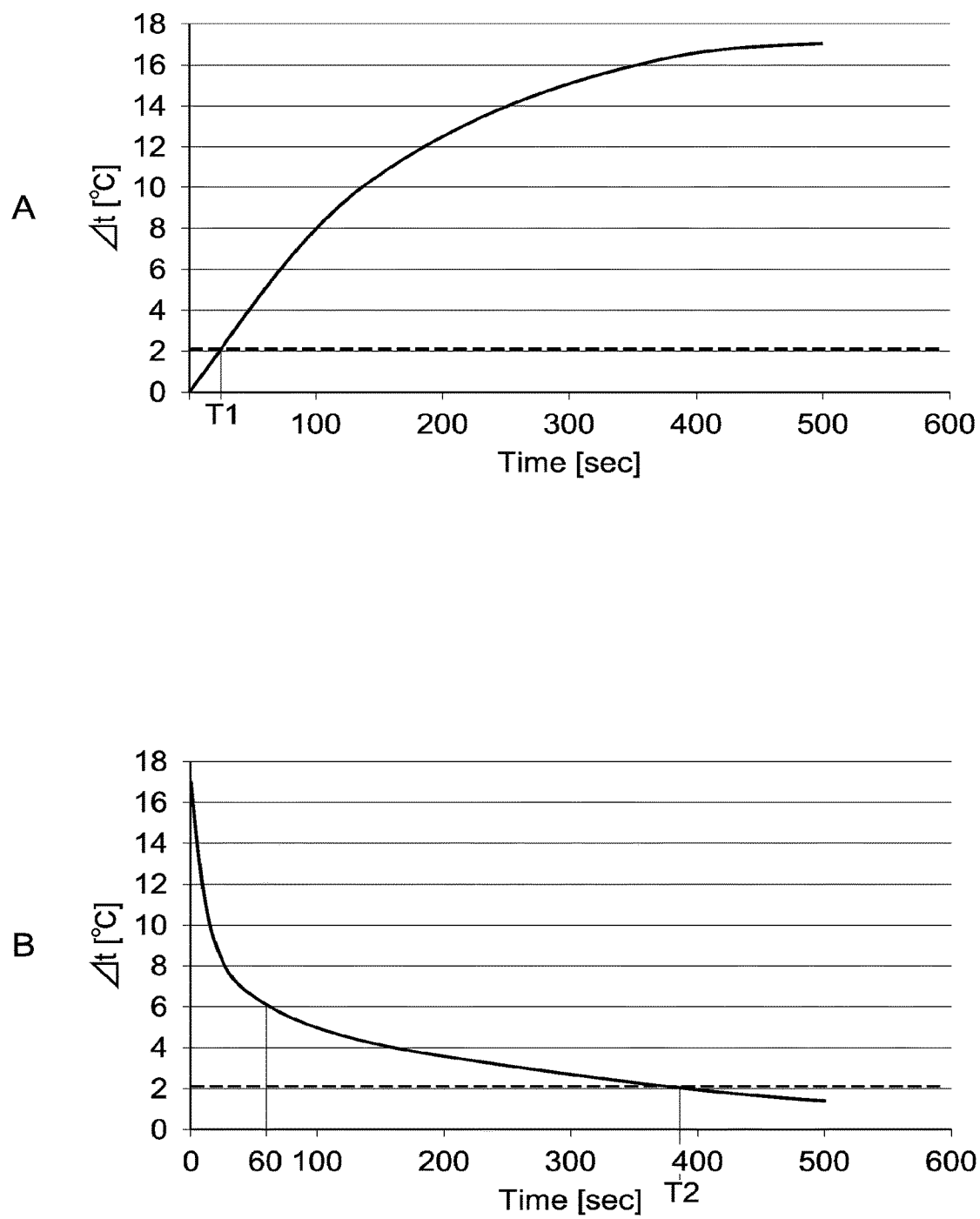
FIG. 12 Graphs showing temporal changes of a temperature difference according to drive of the image display apparatus.

FIG. 12 are graphs showing temporal changes of the temperature difference Δt according to the drive of the image display apparatus. FIG. 12A is a graph showing the temperature difference Δt after the image display apparatus 20 is driven (0 second is drive start timing). FIG. 12B is a graph showing the temperature difference Δt after the image display apparatus 20 is stopped (0 second is drive stop timing).

As indicated by the dotted line in the graphs, 2° C. is set as the first threshold value as in the first control method. As shown in FIG. 12A, in the ON flow, the drive of the fans 58 is started at a time T1 (about 25 seconds later) when the temperature difference Δt becomes equal to or larger than 2° C. after driving the image display apparatus 20.

Meanwhile, as shown in FIG. 12B, a time T2 when the temperature difference Δt becomes smaller than 2° C. after stopping the image display apparatus 20 is after about 390 seconds. Therefore, in the first control method, the drive of the fans 58 is stopped about 390 seconds after the drive of the image display apparatus 20 is stopped.

For readily driving the fans 58 in accordance with the drive of the drive of the image display apparatus 20, it is effective to set the first threshold value to be relatively low. However, in such a case, it may take some time before the fans 58 stop since stopping the image display apparatus 20.

Here, the inventors of the present technology devised the second control method for controlling the drive of the fans 58 on the basis of the temporal change of the temperature difference Δt in the OFF flow. In the present control method, the drive of the fans 58 is stopped in a case where a reduction amount of the temperature difference Δt per unit time becomes equal to or larger than a predetermined threshold value in a state where the fans 58 are driven.

Figure 13:
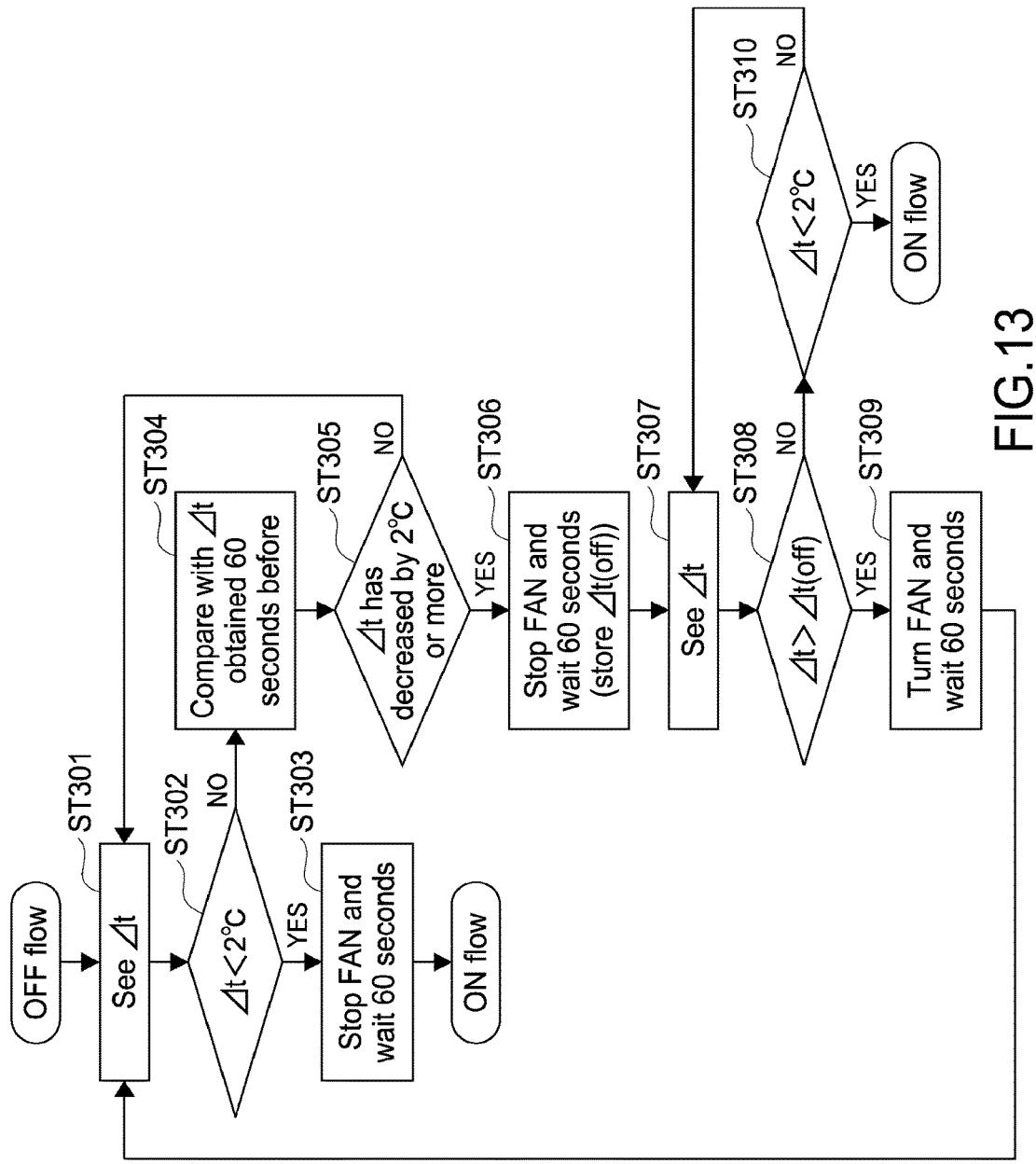
FIG. 13 A flowchart showing an OFF flow of a second control method.

FIG. 13 is a flowchart showing an OFF flow of the second control method. The control unit 46 calculates the temperature difference Δt while the fans 58 are driven (Step 301). It is judged whether or not the temperature difference Δt is smaller than 2° C. as the first threshold value (Step 302). In a case where Δt is smaller than 2° C. (Yes in Step 302), the drive of the fans 58 is stopped, and after waiting for 60 seconds, the processing shifts to the ON flow (Step 303).

In a case where the temperature difference Δt is not smaller than 2° C. (No in Step 302), the temperature difference Δt is compared with the temperature difference Δt measured in 60 seconds before (Step 304). It should be noted that the temperature difference Δt measured in the past is stored in a memory of the control unit 46. For example, in a case where Δt is monitored at arbitrary intervals, the temperature difference Δt at each monitoring timing is stored in the memory. The temperature difference Δt obtained 60 seconds before is read out as appropriate from the stored temperature differences Δt at the respective timings.

In a case where the processing shifts from the ON flow to the OFF flow or the like, the temperature difference Δt obtained before waiting for 60 seconds in Step 103 shown in FIG. 11A, that is, the temperature difference Δt calculated in Step 101, may become the temperature difference Δt obtained 60 seconds before in Step 304.

It is judged whether or not the temperature difference Δt has decreased by 2° C. or more from the temperature difference Δt obtained 60 seconds before (Step 305). In other words, it is judged whether or not "temperature difference Δt obtained 60 seconds before−current temperature difference Δt" is equal to or larger than 2° C. It should be noted that 2° C. as the judgment criterion is a value preset as a second threshold value. In a case where the temperature difference Δt has not decreased by 2° C. or more (No in Step 305), the drive of the fans 58 is not stopped, and the processing returns to Step 301 so that the temperature difference Δt is monitored.

In a case where the temperature difference Δt has decreased by 2° C. or more from the temperature difference Δt obtained 60 seconds before (Yes in Step 305), the drive of the fans 58 is stopped, and a standby time of 60 seconds starts. The temperature difference Δt at that time is stored as a temperature difference Δt during stop (off) (Step 306).

As described above, in the second control method, the fans 58 are stopped in a case where the reduction amount of the temperature difference Δt after an elapse of 60 seconds from the temperature difference Δt at a predetermined timing becomes 2 seconds or more. As shown in FIG. 12B, after the image display apparatus 20 is stopped, the temperature difference Δt decreases precipitously and decreases from about 17° C. to about 6° C. after 60 seconds.

For example, in a case where the timing at which the temperature difference Δt is measured in Step 301 is 10 seconds after the stop of the image display apparatus 20, a difference from the temperature difference Δt obtained 60 seconds before that timing becomes equal to or larger than 2° C. (second threshold value). Therefore, the drive of the fans 58 can be stopped at that timing. In other words, as compared to the first control method, it becomes possible to significantly shorten the timing of stopping the fans 58 and thus realize saving of power consumption, prevention of noise problems, and the like.

It should be noted that 60 seconds corresponds to the unit time for judging the reduction amount and also corresponds to the "predetermined time" in this embodiment. The unit time and the second threshold value are not limited and may be set arbitrarily. In this embodiment, the standby time for preventing chattering and the unit time for judging the reduction amount are set to be the same. Accordingly, the processing can be simplified.

Figure 14:
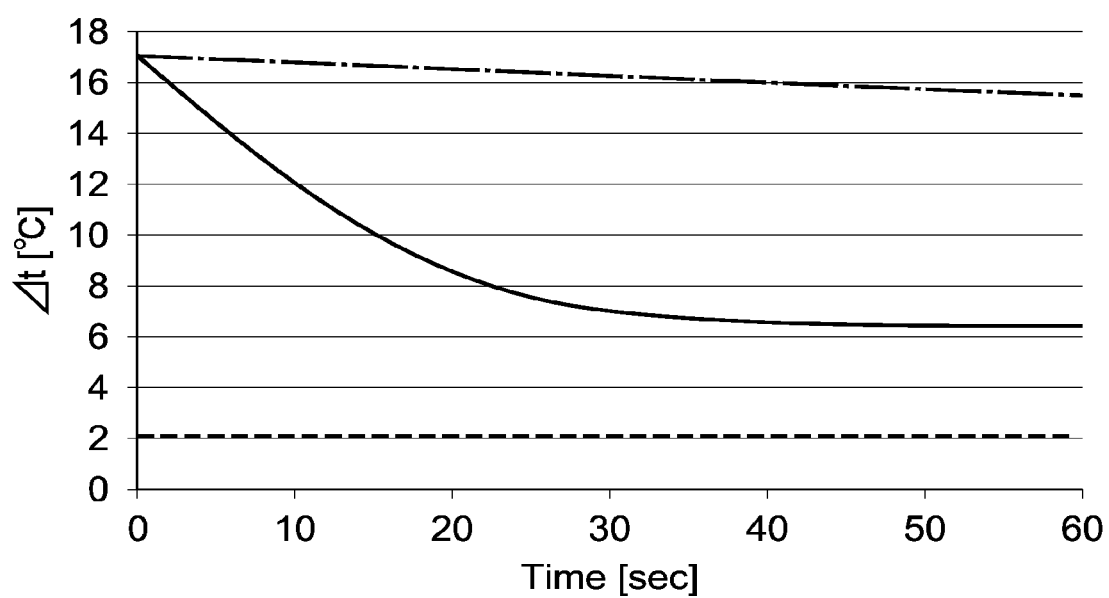
FIG. 14 A graph for explaining an example of a method of setting a second threshold value.

FIG. 14 is a graph for explaining an example of a second threshold value setting method. In the image display apparatus 20 such as a projector, images can be displayed while switching luminance in many cases. Specifically, there are cases where it is possible to make a switch between a high-luminance mode having highest luminance and a low-luminance mode having lowest luminance as modes related to luminance for image display.

In the high-luminance mode, since a large amount of heat is generated from the light source, the temperature difference Δt becomes large. On the other hand, in the low-luminance mode, since a small amount of heat is generated from the light source, the temperature difference Δt also becomes small. Therefore, the temperature difference Δt varies in accordance with the switch of the luminance mode.

The graph indicated by the dashed-dotted line in FIG. 14 is a graph that shows a temporal change of the temperature difference Δt during 60 seconds as the unit time after the high-luminance mode is switched to the low-luminance mode (0 second is mode switch timing). On the other hand, the graph indicated by the solid line is a graph showing a temporal change of the temperature difference Δt during 60 seconds after the image display apparatus driven in the high-luminance mode is stopped (0 second is drive stop timing).

When a switch is made from the high-luminance mode to the low-luminance mode, the temperature difference Δt decreases by about 1.8° C. in 60 seconds. On the other hand, after 60 seconds since stopping the image display apparatus 20, the temperature difference Δt decreases by about 11° C. Taking this difference into consideration, the second threshold value is set to a value larger than about 1.8° C. and smaller than about 11° C. Accordingly, the drive of the fans 58 can be prevented from being stopped erroneously due to the reduction in the temperature difference Δt caused by the switch of the luminance mode. In other words, it becomes possible to highly accurately judge the stop of the drive of the image display apparatus 20 without being influenced by the switch of the luminance mode.

By setting the second threshold value to be sufficiently small within the range described above, it becomes possible to readily stop the fans 58 in accordance with the stop of the drive of the image display apparatus 20. Also taking this point into consideration, in this embodiment, 2° C. is set as the second threshold value. It should be noted that as described in the explanation of the first control method, a margin for preventing chattering may be set for the first threshold value shown in Step 302.

Returning to the OFF flow of FIG. 13, the temperature difference Δt is measured after waiting for 60 seconds (Step 307), and a judgment is made on whether or not the temperature difference Δt is larger than the temperature difference Δt during stop (off) (Step 308). In a case where the temperature difference Δt is larger than the temperature difference Δt (off) (Yes in Step 308), it is judged that the image display apparatus 20 is driven again, and the drive of the fan 58 is started. Then, after waiting for 60 seconds, the processing returns to Step 301 (Step 309).

In a case where the temperature difference Δt is not larger than the temperature difference Δt (off) (No in Step 308), it is judged whether or not the temperature difference Δt is smaller than 2° C. as the first threshold value (Step 310). In a case where the temperature difference Δt is not smaller than 2° C. (No in Step 310), the processing returns to Step 307, and the temperature difference Δt is monitored.

In a case where the temperature difference Δt is smaller than 2° C. (Yes in Step 308), the processing shifts to the ON flow. Even in a case where the temperature difference Δt is larger than the first threshold value, the fans 58 can be accurately controlled in accordance with the drive of the image display apparatus 20 by the processing of Step 307 and subsequent steps. Further, it is possible to cause the processing to smoothly shift to the ON flow in a case where the temperature difference Δt becomes smaller than the first threshold value.

Other Embodiments

The present technology is not limited to the embodiment described above, and various other embodiments can be realized.

In the descriptions above, a difference between the temperature difference Δt before an elapse of the unit time and the temperature difference Δt after an elapse of the unit time is calculated as the reduction amount of Δt in the unit time (temperature difference Δt before elapse of unit time−temperature difference Δt after elapse of unit time). Accordingly, the fans can be easily controlled on the basis of the temporal change. Alternatively, a ratio of the temperature difference Δt after an elapse of the unit time to the temperature difference Δt before an elapse of the unit time may be calculated as the reduction amount of the temperature difference Δt. In addition, an arbitrary method for calculating the reduction amount of the temperature difference Δt may be used.

In the descriptions above, the fan mechanism is provided at the outlet of the dustproof apparatus. In place of or in addition to this, the fan mechanism may be provided at the inlet of the dustproof apparatus. By controlling the drive of the fan mechanism on the basis of the first and second temperature differences Δt and the temporal change of the temperature difference Δt, it is possible to realize saving of power consumption and suppression of noises.

In the descriptions above, the dustproof apparatus that accommodates the image display apparatus has been taken as an example. However, the present technology is also applicable to a case where the image display apparatus is used alone. In other words, the first temperature sensor that measures the first temperature in the vicinity of the inlet and the second sensor that measures the second temperature in the vicinity of the outlet are provided inside the image display apparatus. Then, on the basis of the first and second temperature differences Δt and the temporal change of the temperature difference Δt, the drive of the fans provided in the image display apparatus is controlled. Accordingly, for example, flexible fan control according to the temperature in the image display apparatus becomes possible.

For example, it is assumed that the fans are driven for a predetermined time from a timing the image generation and display operation is ended, and the fans are stopped after that. In this case, it becomes possible to readily lower an internal temperature after stopping the image display apparatus. By this method, however, the temperature inside the image display apparatus after the operation is ended is not taken into consideration.

In contrast, by applying the control method according to the present technology, it becomes possible to drive the fans in accordance with the temperature inside the image display apparatus after the operation is ended, and also optimize rotations of the fans such that the temperature in the apparatus becomes a desired temperature, for example. As a result, unnecessary operations of the fans can be prevented, and a lifetime of the fans can be prolonged.

The dustproof apparatus according to the present technology is also applicable to apparatuses other than the image display apparatus such as a projector. Further, a target on which the image display system according to the present technology is to be set is not limited to the ceiling, and a case where the image display system is set on a lower surface of a predetermined apparatus, or the like is also possible.

Regarding the attachment of the dustproof apparatus, the dustproof apparatus according to the present technology can be set on the ceiling while, in an upside-down state, the image display apparatus is held on the base portion. Then, after that, the top cover is attached to the base portion so as to cover the image display apparatus. Accordingly, for example, it becomes possible to set the image display system on the ceiling in a manner and sensation substantially similar to those when attaching a ceiling light. As a result, extremely high workability can be exerted regarding the setting of the image display system.

At least two of the feature portions according to the present technology described above can be combined. In other words, various feature portions described in the respective embodiments may be arbitrarily combined without distinguishing the embodiments from one another. Moreover, the various effects described above are mere examples and should not be limited thereto, and other effects may also be exerted.

It should be noted that the present technology can also take the following configurations.

(1) A dustproof apparatus, including:
a casing portion that is capable of accommodating an image display apparatus and includes an inlet and an outlet that discharges air sucked in from the inlet;
a fan portion that is provided at the outlet or the inlet;
a sensor unit capable of respectively measuring a first temperature which is a temperature of the air in a vicinity of the inlet and a second temperature which is a temperature of the air in a vicinity of the outlet; and
a control unit that controls drive of the fan portion on a basis of a temperature difference between the first temperature and the second temperature measured by the sensor unit.

(2) The dustproof apparatus according to (1), in which the control unit controls the drive of the fan portion on a basis of a temporal change of the temperature difference.

(3) The dustproof apparatus according to (1) or (2), in which the control unit starts the drive of the fan portion in a case where the temperature difference becomes equal to or larger than a first threshold value and stops the drive of the fan portion in a case where the temperature difference becomes smaller than the first threshold value.

(4) The dustproof apparatus according to (2) or (3), in which the control unit stops the drive of the fan portion in a case where, while the fan portion is driven, a reduction amount of the temperature difference per unit time becomes equal to or larger than a predetermined threshold value.

(5) The dustproof apparatus according to (4), in which the control unit stops the drive of the fan portion in a case where, while the fan portion is driven, a reduction amount of the temperature difference with respect to the temperature difference at a predetermined timing, that is obtained after an elapse of a predetermined time since the predetermined timing, becomes equal to or larger than a second threshold value.

(6) The dustproof apparatus according to (5), in which the second threshold value is set on a basis of a reduction amount of the temperature difference with respect to the temperature difference at a timing at which the image display apparatus that operates in a high-luminance mode with highest luminance is switched to a low-luminance mode with lowest luminance, that is obtained after an elapse of the predetermined time since that switch timing.

(7) The dustproof apparatus according to any one of (1) to (6), in which
the image display apparatus includes a first supply port for supplying the air to an optical system including a light source and a second supply port for supplying the air to a cooling unit for cooling the light source,
the dustproof apparatus further includes
a division portion that divides an internal space of the casing portion into a first area including the first supply port and a second area including the second supply port, and
the sensor unit is provided in the second area.

(8) The dustproof apparatus according to (7), in which
the inlet includes a first suction area that opposes the first supply port and sucks in the air into the first area and a second suction area that opposes the second supply port and sucks in the air into the second area,
the casing portion includes a filter portion provided in the first suction area, and
the sensor unit includes a first temperature sensor provided in a vicinity of the second suction area and a second temperature sensor provided in a vicinity of the outlet.

(9) The dustproof apparatus according to (8), in which
the image display apparatus includes a first outlet for discharging air sucked in from the first supply port and a second outlet for discharging air sucked in from the second supply port,
the division portion performs the division into the first area and the second area such that the first outlet is included in the first area and the second outlet is included in the second area, and
the second temperature sensor is provided between the outlet and the second outlet.

(10) The dustproof apparatus according to (9), in which
the fan portion is provided between the outlet and the first outlet, and
the second temperature sensor is provided at a position deviated from a flow channel of air sucked in by the fan portion.

REFERENCE SIGNS LIST

CA clean air area
NA normal air area
10 dustproof apparatus
20 image display apparatus
27 inlet
27a first supply port
27b second supply port
28 outlet
28a first supply port
28b second supply port
40 base portion
45 fan mechanism
46 control unit
48 sensor unit
48a first temperature sensor
48b second temperature sensor
57 air separation portion
70 top cover
71 inlet
71a first suction area
71b second suction area
72 filter block
73 outlet
79 divisional cushion portion
100 image display system

The invention claimed is:

1. A dustproof apparatus, comprising:
a casing that is capable of accommodating an image display apparatus and includes an inlet and an outlet that discharges air sucked in from the inlet;
a fan that is provided at the outlet or the inlet;
a sensor capable of respectively measuring a first temperature which is a temperature of the air in a vicinity of the inlet and a second temperature which is a temperature of the air in a vicinity of the outlet; and
control circuitry configured to control drive of the fan on a basis of a temperature difference between the first temperature and the second temperature measured by the sensor,
wherein the control circuitry is further configured to control the drive of the fan on a basis of a change in the temperature difference, and
wherein the control circuitry stops the drive of the fan in a case in which, while the fan is driven, a reduction amount of the temperature difference per unit time becomes equal to or larger than a predetermined threshold value.

2. The dustproof apparatus according to claim 1, wherein the control unit starts the drive of the fan portion in a case where the temperature difference becomes equal to or larger than a first threshold value and stops the drive of the fan portion in a case where the temperature difference becomes smaller than the first threshold value.

3. The dustproof apparatus according to claim 1, wherein the control unit stops the drive of the fan portion in a case where, while the fan portion is driven, a reduction amount of the temperature difference with respect to the temperature difference at a predetermined timing, that is obtained after an elapse of a predetermined time since the predetermined timing, becomes equal to or larger than a second threshold value.

4. The dustproof apparatus according to claim 3, wherein the second threshold value is set on a basis of a reduction amount of the temperature difference with respect to the temperature difference at a timing at which the image display apparatus that operates in a high-luminance mode with highest luminance is switched to a low-luminance mode with lowest luminance, that is obtained after an elapse of the predetermined time since that switch timing.

5. The dustproof apparatus according to claim 1, wherein the image display apparatus includes a first supply port for supplying the air to an optical system including a light source and a second supply port for supplying the air to a cooling unit for cooling the light source,
the dustproof apparatus further comprises
a division portion that divides an internal space of the casing portion into a first area including the first supply port and a second area including the second supply port, and
the sensor unit is provided in the second area.

6. The dustproof apparatus according to claim 5, wherein the inlet includes a first suction area that opposes the first supply port and sucks in the air into the first area and a second suction area that opposes the second supply port and sucks in the air into the second area,
the casing portion includes a filter portion provided in the first suction area, and
the sensor unit includes a first temperature sensor provided in a vicinity of the second suction area and a second temperature sensor provided in a vicinity of the outlet.

7. The dustproof apparatus according to claim 6, wherein the image display apparatus includes a first outlet for discharging air sucked in from the first supply port and a second outlet for discharging air sucked in from the second supply port,
the division portion performs the division into the first area and the second area such that the first outlet is included in the first area and the second outlet is included in the second area, and
the second temperature sensor is provided between the outlet and the second outlet.

8. The dustproof apparatus according to claim 7, wherein the fan portion is provided between the outlet and the first outlet, and
the second temperature sensor is provided at a position deviated from a flow channel of air sucked in by the fan portion.

9. An image display system, comprising:
an image display apparatus; and
a dustproof apparatus including
   a casing that is capable of accommodating the image display apparatus and includes an inlet and an outlet that discharges air sucked in from the inlet,
   a fan that is provided at the outlet or the inlet,
   a sensor capable of respectively measuring a first temperature which is a temperature of the air in a vicinity of the inlet and a second temperature which is a temperature of the air in a vicinity of the outlet, and
   control circuitry configured to control drive of the fan on a basis of a temperature difference between the first temperature and the second temperature measured by the sensor,
wherein the control circuitry is further configured to control the drive of the fan on a basis of a change in the temperature difference, and
wherein the control circuitry stops the drive of the fan in a case in which, while the fan is driven, a reduction amount of the temperature difference per unit time becomes equal to or larger than a predetermined threshold value.

10. A control method, comprising:
measuring, by a sensor, a first temperature which is a temperature of air in a vicinity of an inlet of a dustproof apparatus capable of accommodating an image display apparatus and a second temperature which is a temperature of air in a vicinity of an outlet of the dustproof apparatus that discharges air sucked in from the inlet; and
controlling, by circuitry, drive of a fan portion provided at the outlet or the inlet of the dustproof apparatus on a basis of a temperature difference between the measured first temperature and second temperature,
wherein the controlling further comprises controlling the drive of the fan on a basis of a change in the temperature difference and stopping the drive of the fan in a case in which, while the fan is driven, a reduction amount of the temperature difference per unit time becomes equal to or larger than a predetermined threshold value.

* * * * *